(12) United States Patent  
Yang et al.

(10) Patent No.: US 12,426,292 B2  
(45) Date of Patent: Sep. 23, 2025

(54) SEMICONDUCTOR DEVICE WITH TUNABLE THRESHOLD VOLTAGE AND METHOD FOR MANUFACTURING THE SAME

(71) Applicant: TAIWAN SEMICONDUCTOR MANUFACTURING COMPANY, LTD., Hsinchu (TW)

(72) Inventors: Chansyun David Yang, Hsinchu (TW); Huang-Lin Chao, Hsinchu (TW); Hsiang-Pi Chang, Hsinchu (TW); Yen-Tien Tung, Hsinchu (TW); Chung-Liang Cheng, Hsinchu (TW); Yu-Chia Liang, Hsinchu (TW); Shen-Yang Lee, Hsinchu (TW); Yao-Sheng Huang, Hsinchu (TW); Tzer-Min Shen, Hsinchu (TW); Pinyen Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 551 days.

(21) Appl. No.: 17/865,846

(22) Filed: Jul. 15, 2022

(65) Prior Publication Data

US 2024/0021709 A1 Jan. 18, 2024

(51) Int. Cl.
*H10D 30/01* (2025.01)
*H01L 21/28* (2006.01)
*H01L 21/768* (2006.01)
*H10D 84/01* (2025.01)
*H10D 84/03* (2025.01)

(52) U.S. Cl.
CPC ..... *H10D 30/024* (2025.01); *H01L 21/28185* (2013.01); *H01L 21/76811* (2013.01); *H10D 84/0167* (2025.01); *H10D 84/038* (2025.01)

(58) Field of Classification Search
CPC ............ H10D 30/024; H01L 21/28185; H01L 21/76811
USPC ........................................................ 257/288
See application file for complete search history.

(56) References Cited

U.S. PATENT DOCUMENTS

2021/0082766 A1* 3/2021 Miura ................. H10D 84/038  
2021/0082915 A1* 3/2021 Bao ....................... H10D 84/853  
(Continued)

*Primary Examiner* — Quoc D Hoang  
(74) *Attorney, Agent, or Firm* — Birch, Stewart, Kolasch & Birch, LLP

(57) ABSTRACT

A semiconductor device includes a channel layer, an interfacial layer, a gate dielectric layer, a gate electrode, dipole elements, and additional elements. The interfacial layer is disposed on the channel layer, and includes an insulating material. The gate dielectric layer is disposed over the interfacial layer such that the channel layer is separated from the gate dielectric layer by the interfacial layer. The gate electrode is disposed on the gate dielectric layer. The dipole elements are present in at least one of the interfacial layer and the gate dielectric layer in a predetermined amount such that the semiconductor device has a predetermined threshold voltage. The additional elements are located at a region where the dipole elements are present so as to reduce interfacial defects caused by the dipole elements. The additional elements are different from the dipole elements. Methods for manufacturing the semiconductor device are also disclosed.

20 Claims, 19 Drawing Sheets

(56) References Cited

U.S. PATENT DOCUMENTS

2023/0261074 A1* 8/2023 Bao .................... H10D 30/6757
                                                                257/288
2023/0411520 A1* 12/2023 Lee .................... H01L 21/28185
2024/0096993 A1* 3/2024 Lee ........................ H10D 84/83

* cited by examiner

FIG. 6

| n03 | n02 | n01 | p01 | p02 | p03 |
|---|---|---|---|---|---|
| 52 | 52 | 52 | 52 | 52 | 52 |
| 51 | 51 | 51 | 51 | 51 | 51 |
| 41 | 41 | 41 | 41 | 41 | 41 |

FIG. 7

| n03 | n02 | n01 | p01 | p02 | p03 |
|---|---|---|---|---|---|
| 54 | 54 | 54 | 54 | 54 | 54 |
| 531 | 531 | 531 | 531 | 531 | 531 |
| 52 | 52 | 52 | 52 | 52 | 52 |
| 51 | 51 | 51 | 51 | 51 | 51 |
| 41 | 41 | 41 | 41 | 41 | 41 |

| n03 | n02 | n01 | p01 | p02 | p03 |
|-----|-----|-----|-----|-----|-----|
| 52D | 52D | 52  | 52D | 52D | 52  |
| 51  | 51  | 51  | 51  | 51  | 51  |
| 41  | 41  | 41  | 41  | 41  | 41  |

FIG. 13

| n03 | n02 | n01 | p01 | p02 | p03 |
|-----|-----|-----|-----|-----|-----|
| 57  | 57  | 57  | 57  | 57  | 57  |
| 56  | 56  | 56  | 56  | 56  | 56  |
| 52D | 52D | 52  | 52D | 52D | 52  |
| 51  | 51  | 51  | 51  | 51  | 51  |
| 41  | 41  | 41  | 41  | 41  | 41  |

SEMICONDUCTOR DEVICE WITH TUNABLE THRESHOLD VOLTAGE AND METHOD FOR MANUFACTURING THE SAME

BACKGROUND

Transistors are key active components in modern integrated circuits (IC). With rapid development of semiconductor technology, critical dimension (CD) of transistors keeps shrinking and various three-dimensional (3D) transistor structures are springing up, making it possible to integrate a large number of transistors per unit area. In addition, transistors in IC may have multiple specifications (e.g., threshold voltage, saturation current, off-current, etc.) according to variety of IC circuit design. Therefore, a 3D structure for advanced node transistors that have multiple specifications and high reliability, and/or a method for manufacturing such 3D structure is in continuous development.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 21 illustrate schematic views of intermediate stages of the method depicted in FIG. 1 in accordance with some embodiments.

DETAILED DESCRIPTION

Figure 1:
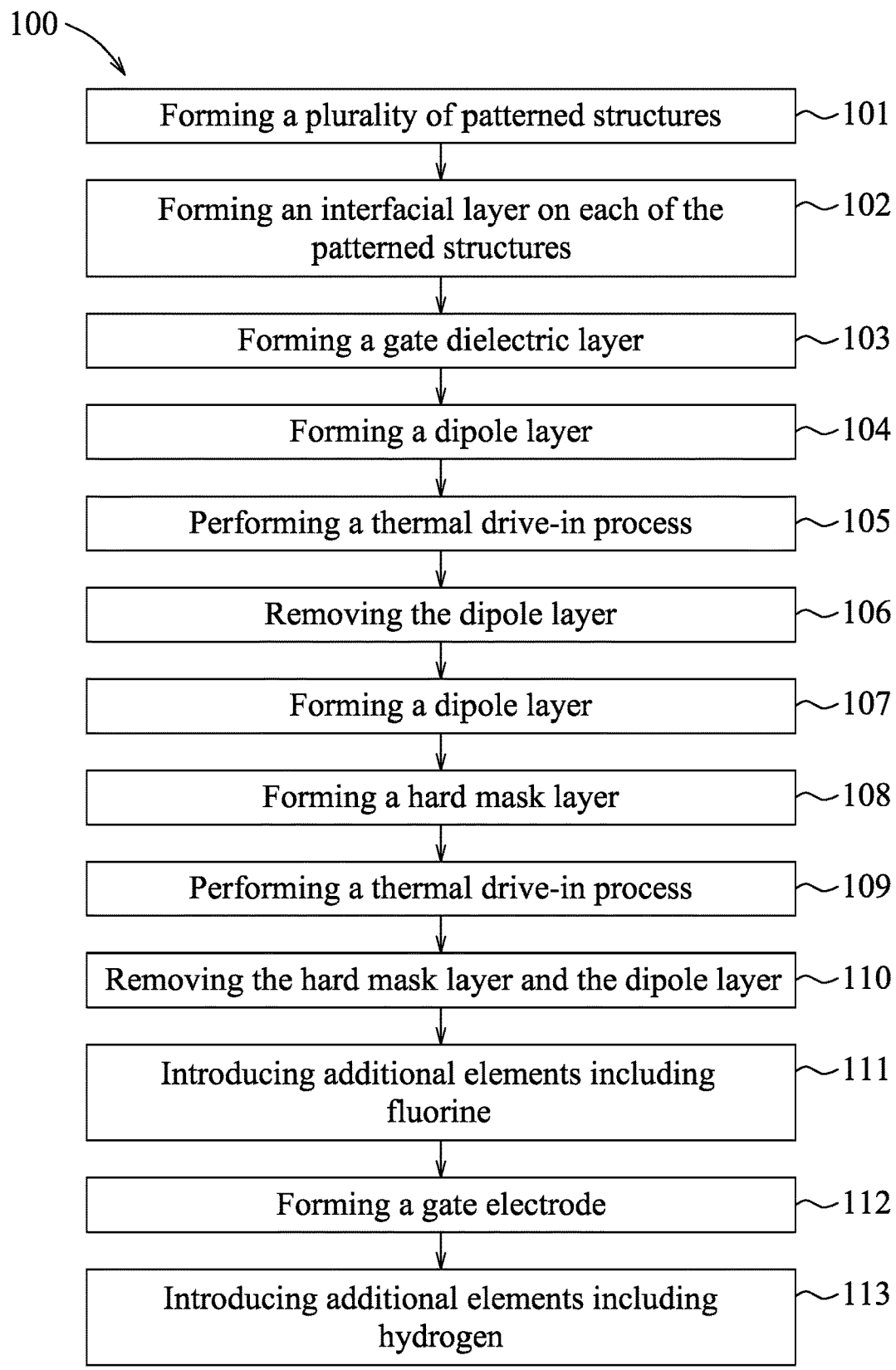
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a chip includes a plurality of semiconductor devices with different threshold voltages according to customized requirements. In advanced technology nodes, threshold voltage of each of the semiconductor devices may be controlled by material selection of work function metal layer(s) disposed on a gate dielectric layer opposite to a channel layer, by adjusting thickness of the work function metal layer(s), or by changing concentration of impurities in the channel layer. For semiconductor devices with a gate-all-around (GAA) structure, each of which includes a plurality of the channel layers separated from each other, controlling the concentration of impurities in each of the channel layers to be the same as each other by an ion implantation process is a challenge. Furthermore, along with the dimensional shrinkage of the semiconductor devices, the spacing between two adjacent ones of the channel layers may be insufficient to fill the work function metal layer(s) with a predetermined thickness, causing a relatively low threshold voltage difficult to be achieved. The present disclosure is directed to a semiconductor structure including a plurality of semiconductor devices which may have different values of threshold voltage (Vt) through introduction of dipole elements in a desired position. The semiconductor structure may be applied to planar field effect transistors (FET), fin-type FETs (FinFET), multi-gate FETs (e.g., GAA FETs), multi-bridge channel FETs (MBCFET), fork-sheet FETs, etc.), or other suitable devices.

FIG. 1 is a flow diagram illustrating a method 100 for manufacturing a semiconductor structure (for example, the semiconductor structure 20 shown in FIG. 19) in accordance with some embodiments. FIGS. 2 to 21 illustrate schematic views of intermediate stages of the method 100 in accordance with some embodiments.

Figure 2:
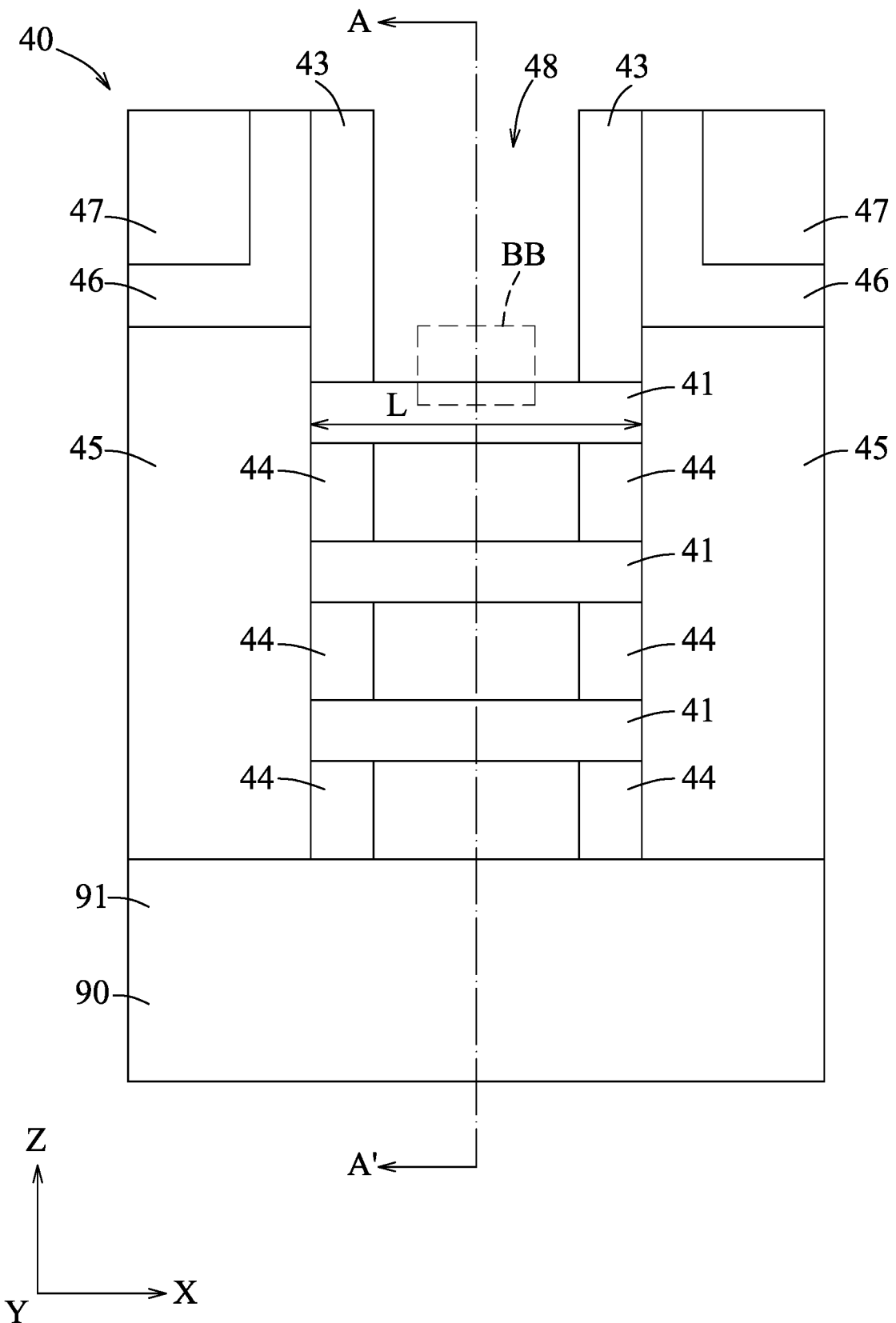
Figure 3:
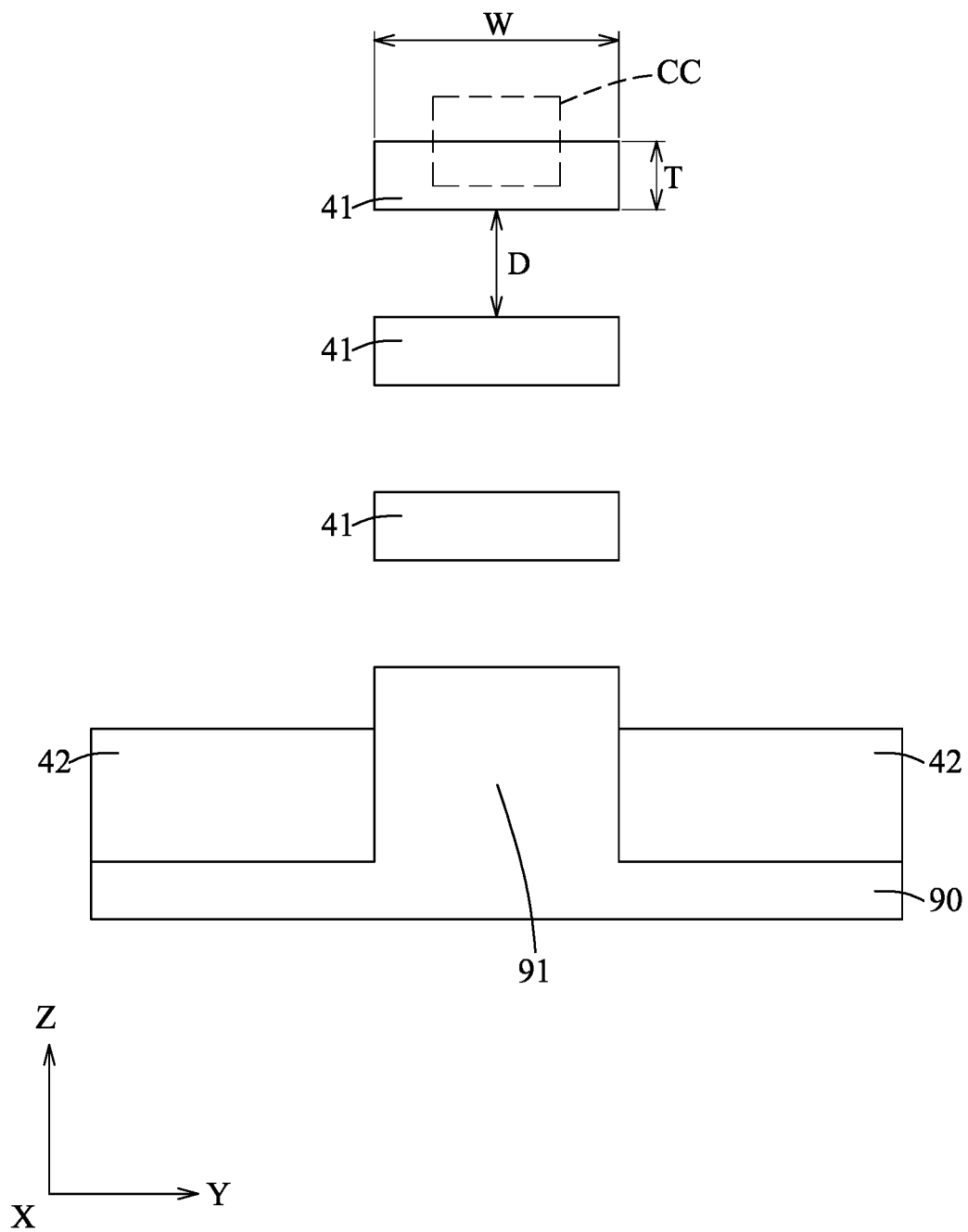
Figure 4:
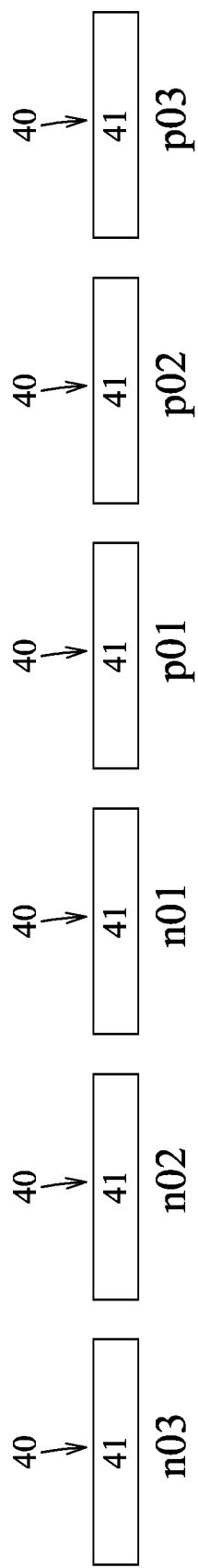

Referring to FIG. 1 and the examples illustrated in FIGS. 2 to 4, the method 100 begins at step 101, where a plurality of patterned structures 40 are formed. FIG. 2 is a schematic sectional view of one of the patterned structures 40 in accordance with some embodiments. FIG. 3 is a schematic sectional view of the one of the patterned structures 40 taken long line A-A' of FIG. 2. FIG. 4 is a schematic view illustrating regions BB of the patterned structures 40 (each being shown in FIG. 2) or regions CC of the patterned structures 40 (each being shown in FIG. 3). It should be noted that although the method 100 is exemplified using a method for manufacturing a GAA structure including a plurality of GAA devices (one of which is exemplified by the semiconductor device 30 shown in FIGS. 20 and 21), the method 100 may be used for manufacturing other suitable structures.

As shown in FIGS. 2 and 3, the patterned structures 40 (one of which is shown) are formed on a semiconductor substrate 90. In some embodiments, the semiconductor substrate 90 includes first, second and third n-type regions n01, n02, n03, and first, second and third p-type regions p01, p02, p03, i.e., six of the patterned structures 40 are to be respectively formed thereon, as shown in FIG. 4. The number of the patterned structures 40 or the number of the semiconductor devices 30 to be subsequently and respectively formed from the patterned structures 40 can be varied according to the circuit design of the semiconductor structure 20 (see FIG. 19).

Each of the patterned structures 40 includes at least one channel layer 41. In some embodiments, each of the patterned structures 40 includes a plurality of channel layers 41 separated from each other in a Z direction. For example, as shown in FIGS. 2 and 3, the number of the channel layers 41 in each of the patterned structures 40 is three, but is not limited thereto. With continuous shrinkage of the scale of the semiconductor devices 30, a distance (D) between two adjacent ones of the channel layers 41 in the Z direction in each of the patterned structures 40 becomes smaller. In some embodiments, two adjacent ones of the channel layers 41 are separated from each other by the distance (D) ranging from about 4 nm to about 12 nm. In some embodiments, each of the channel layers 41 may have a thickness (T) in the Z direction, and the thickness (T) ranges from about 5 nm to about 8 nm. In some embodiments, each of the channel layers 41 may have a width (W) in a Y direction transverse to the Z direction or a length (L) in an X direction transverse to the Y and Z directions, and each of the width (W) and the length (L) ranges from about 15 nm to about 50 nm. In some not-shown embodiments, when the method 100 is used for manufacturing a FinFET structure including a plurality of the FinFET devices, the patterned structures for forming the FinFET devices each includes a single channel layer, and the channel layers of the patterned structures may also be denoted by the numeral 41 shown in FIG. 4. In some embodiments, the semiconductor substrate 90 may be made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The material for forming the semiconductor substrate 90 may be doped with p-type impurities or n-type impurities, or undoped. In addition, the semiconductor substrate 90 may be a bulk silicon substrate, a silicon-on-insulator (SOI) substrate, or a germanium-on-insulator (GOI) substrate. Other suitable materials for the semiconductor substrate 90 are within the contemplated scope of the present disclosure. In some embodiments, the channel layers 41 of the patterned structures 40 may be made from a material the same or different from that of the semiconductor substrate 90. Since suitable materials for the channel layers 41 are similar to those for the semiconductor substrate 90, the details thereof are omitted for the sake of brevity.

In some embodiments, as shown in FIGS. 2 and 3, each of the patterned structures 40 (one of which is shown) further includes two isolation portions 42, two gate spacers 43, a plurality of inner spacers 44, two source/drain portions 45, two contact etching stop layers (CESLs) 46, and two interlayer dielectric (ILD) layers 47.

In some embodiments, each of the patterned structures 40 may be formed by (i) patterning a substrate and a stack (not shown) formed thereon to form a fin structure on the semiconductor substrate 90 (the substrate is patterned into the semiconductor substrate 90 and a lower portion 91 of the fin structure, and the stack is patterned into an upper portion of the fin structure including a plurality of sacrificial films and a plurality of channel films disposed to alternate with the sacrificial films), (ii) forming an isolation layer over the semiconductor substrate 90 and the fin structure followed by a planarization process, for example, but not limited to, chemical mechanism polishing (CMP), to form isolation regions at two opposite sides of the fin structure, (iii) recessing the isolation regions to form the isolation portions 42 so as to expose the upper portion of the fin structure and an upper part of the lower portion 91 of the fin structure, (iv) forming a dummy gate portion (not shown) over the fin structure such that the fin structure has two portions exposed from the dummy gate portion and located at two opposite sides of the dummy gate portion in the X direction, (v) forming the gate spacers 43 at two opposite sides of the dummy gate portion, (vi) etching the exposed portions of the fin structure to form source/drain recesses (not shown), such that the channel films are patterned into the channel layers 41 and the sacrificial films are patterned into sacrificial layers (not shown), (vii) recessing the sacrificial layers through the source/drain recesses to form recesses, (viii) forming the inner spacers 44 in the recesses to cover the remaining sacrificial layers, (ix) forming the source/drain portions 45 respectively in the source/drain recesses, such that each of the channel layers 41 extends between the source/drain portions 45, (x) forming the CESL 46 and the ILD layers 47 on the source/drain portions 45, and (xi) removing the dummy gate portion and the remaining sacrificial layers using a wet etching process or other suitable processes to form a cavity 48. Other suitable processes for forming the patterned structures 40 are within the contemplated scope of the present disclosure.

The channel films in the fin structure are made of a material the same as that of the channel layers 41. The sacrificial films in the fin structure may include a material different from that of the channel films, so that the sacrificial layers formed from the sacrificial films can be selectively removed and the channel layers 41 are substantially not removed. Suitable materials for forming the sacrificial films are similar to those for forming the channel layers 41, and thus details of possible materials for the sacrificial films are omitted for the sake of brevity.

The isolation portions 42 are provided for isolating two adjacent ones of the patterned structures 40. The isolation portions 42 may each be a portion of a shallow trench isolation (STI), a deep trench isolation (DTI), or other suitable structures, and may be made of an oxide material (for example, silicon oxide), a nitride material (for example, silicon nitride), or a combination thereof. Other suitable materials for the isolation portions 42 are within the contemplated scope of the present disclosure.

The dummy gate portion may include a dummy gate dielectric formed on the fin structure, a dummy gate electrode formed on the dummy gate dielectric opposite to the fin structure, and a hard mask formed on the dummy gate electrode opposite to the dummy gate dielectric. In some embodiments, the hard mask may include silicon nitride, silicon oxide, silicon oxynitride, or combinations thereof, the dummy gate electrode may include polycrystalline silicon, single crystalline silicon, amorphous silicon, or combinations thereof, and the dummy gate dielectric may include silicon oxide, silicon nitride, silicon oxynitride, high dielectric constant (k) materials, or combinations thereof. Other suitable materials for the dummy gate portion are within the contemplated scope of the present disclosure.

Each of the gate spacers 43, the CESLs 46, and the ILD layers 47 may independently include silicon oxide, silicon nitride, silicon oxynitride, or combinations thereof. The inner spacer 44 may include a low dielectric constant (k) material such as silicon oxynitride, silicon oxycarbide, or silicon oxycarbonitride. Other suitable materials for the gate spacers 43, the inner spacers 44, the CESLs 46, and the ILD layers 47 are within the contemplated scope of the present disclosure.

The source/drain portions 45 may be doped with an n-type impurity or a p-type impurity, and may be formed as a single layer structure or a multi-layered structure having several sub-layers with different doping concentration. For example, in some embodiments, the source/drain portions 45 at each of the first, second and third p-type regions p01, p02, p03 (see FIG. 4) may have a conductivity type different from those at each of the first, second and third n-type regions n01, n02, n03 (see FIG. 4). In some embodiments, each of the source/drain portions 45 at each of the first, second and third p-type regions p01, p02, p03 has a p-type conductivity, and includes single crystalline or polycrystalline silicon, single crystalline or polycrystalline silicon germanium, or other suitable materials doped with a p-type impurity so as to function as a source/drain of a p-FET. The p-type impurity may be, for example, but not limited to, boron (B), aluminum (Al), gallium (Ga), indium (In), other suitable materials, or combinations thereof. In some embodiments, each of the source/drain portions 45 at each of the first, second and third n-type regions n01, n02, n03 has an n-type conductivity, and includes single crystalline silicon, polycrystalline silicon or other suitable materials doped with an n-type impurity so as to function as a source/drain of an n-FET. The n-type impurity may be, for example, but not limited to, nitrogen (N), phosphorous (P), arsenic (As), antimony (Sb), other suitable materials, or combinations thereof. In some embodiments, the conductivity types of the source/drain portions 45 at each of the first, second and third p-type regions p01, p02, p03 and at each of the first, second and third n-type regions n01, n02, n03 may be swapped, that is, the source/drain portions 45 at each of the first, second and third p-type regions p01, p02, p03 have an n-type conductivity, and the source/drain portions 45 at each of the first, second and third n-type regions n01, n02, n03 have a p-type conductivity. It is noted that each of the source/drain portions 45 may refer to a source or a drain, individually or collectively dependent upon the context.

For purposes of simplicity and clarity, in FIGS. 5 to 21, at each of the first, second and third n-type regions n01, n02, n03, and the first, second and third p-type regions p01, p02, p03, an upper portion of one of the channel layers 41 and element(s) formed thereon are shown and described below, while other elements are omitted.

Figure 5:
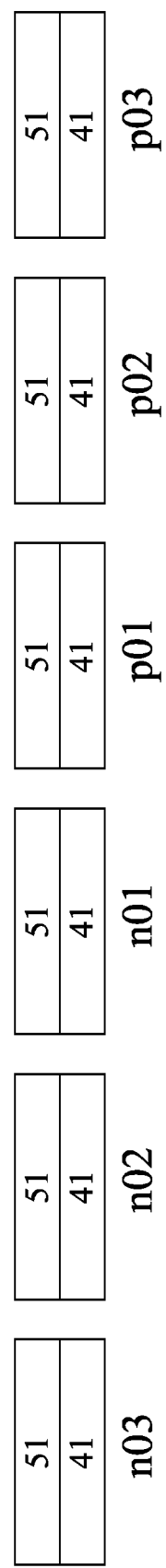

Referring to FIG. 1 and the example illustrated in FIG. 5, the method 100 proceeds to step 102, where at each of the patterned structures 40 of the first, second and third n-type regions n01, n02, n03, and the first, second and third p-type regions p01, p02, p03, an interfacial layer 51 is formed on the channel layer 41. In some embodiments, at each of the regions n01, n02, n03, p01, p02, p03, the interfacial layer 51 is formed around the channel layer 41 (see FIG. 21, in which the interfacial layers are denoted as 51H). In some embodiments, at each of the regions n01, n02, n03, p01, p02, p03, the interfacial layer 51 may be formed on upper and side surfaces of the lower portion 91 (see FIGS. 20 and 21, in which the interfacial layers are denoted as 51H) of the fin structure. The interfacial layer 51 may serve as a buffer layer for facilitating growth of a layer to be subsequently formed thereon, and may include an insulating material. The insulating material includes silicon oxide, silicon nitride, silicon oxynitride, or combinations thereof. Other suitable materials for the interfacial layer 51 are within the contemplated scope of the present disclosure. In some embodiments, the interfacial layer 51 has a thickness ranging from about 5 Å to about 10 Å. In some embodiments, the interfacial layer 51 is formed using chemical vapor deposition (CVD), atomic layer deposition (ALD), thermal oxidation, or wet chemical oxidation. Other suitable techniques for forming the interfacial layer 51 are within the contemplated scope of the present disclosure. In some embodiments, formation of the interfacial layer 51 further includes a cleaning process for surface treatment of the interfacial layer 51 after deposition thereof.

Referring to FIG. 1 and the example illustrated in FIG. 6, the method 100 proceeds to step 103, where a gate dielectric layer 52 is formed on the interfacial layer 51 at each of the first, second and third n-type regions n01, n02, n03, and the first, second and third p-type regions p01, p02, p03 using CVD, ALD, or other suitable deposition techniques. In some embodiments, the gate dielectric layer 52 may also be formed on the inner spacers 44, the gate spacers 43, the CESLs 46, the ILD layers 47, and the isolation portions (see FIGS. 2 and 3) at each of the patterned structure 40 at each of the regions n01, n02, n03, p01, p02, p03. In some embodiments, the gate dielectric layer 52 includes silicon oxide, silicon nitride, silicon oxynitride, high dielectric constant (k) materials (i.e., dielectric materials having k-value greater than about 3.9), other suitable materials, or combinations thereof. For example, the gate dielectric layer 52 may be made of hafnium oxide ($HfO_x$), zirconia oxide ($ZrO_x$), or hafnium zirconia oxide ($ZrO_x$), but is not limited thereto. Other suitable materials for forming the gate dielectric layer 52 are within the contemplated scope of the present disclosure. In some embodiments, the gate dielectric layer 52 has a thickness ranging from about 8 Å to about 20 Å. In some embodiments, thickness, as well as film quality of the gate dielectric layer 52 may be adjusted by controlling parameter(s) of the deposition techniques (e.g., process pressure, process temperature, process time, concentration(s) of precursor gas(es), flow rate(s) of precursor gas(es), and so on). Each of the thickness and film quality of the gate dielectric layer 52 may be one of factors that influences diffusion rate of dipole elements to be subsequently diffusing therethrough. For example, the diffusion rate of the dipole elements may be greater when the film quality of the gate dielectric layer 52 is less dense, and vice versa. It is indicated that an amount of the dipole elements diffusing through the gate dielectric layer 52 may be greater as well, thereby resulting in a greater reduction in the threshold voltage of the semiconductor device 30 (see FIG. 20).

Figure 10:
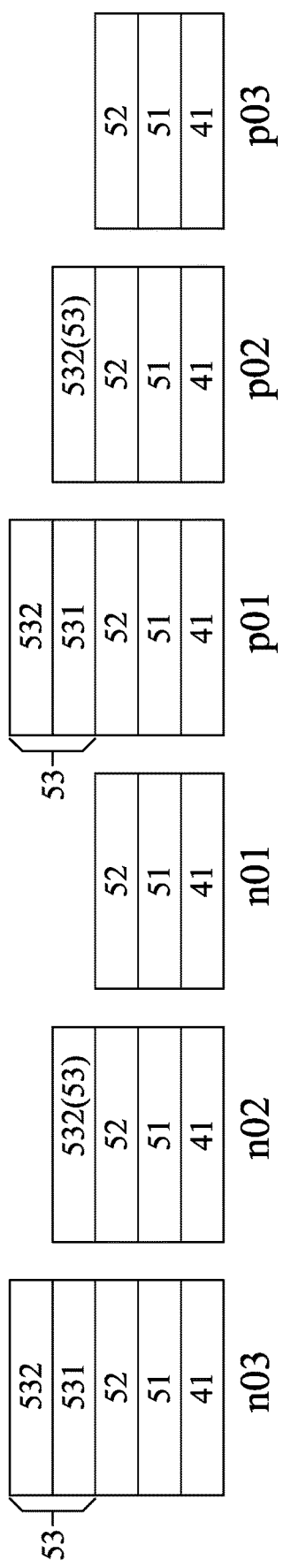

Referring to FIG. 1 and the example illustrated in FIG. 10, the method 100 proceeds to step 104, where a dipole layer 53 is formed on the gate dielectric layer 52 at each of the second and third n-type regions n02, n03, and the first and second p-type regions p01, p02. The dipole layer 53 serves as a source that provides first dipole elements to be diffused into at least one of the interfacial layer 51 and the gate dielectric layer 52, and thus the dipole layer 53 includes the first dipole elements. In some embodiments, the first dipole elements includes zinc (Zn), gallium (Ga), lanthanum (La), magnesium (Mg), aluminum (Al), or combinations thereof. In some embodiments, the dipole layer 53 includes an oxide, a nitride, a carbide, an oxynitride, an oxycarbide, a carbonitride, an oxycarbonitride, a metal oxide, a metal nitride, a metal carbide, a metal oxynitride, or combinations thereof, each of which contains the abovementioned first dipole elements. For example, when lanthanum is selected as the first dipole elements, the dipole layer 53 may be made of lanthanum oxide, lanthanum nitride, lanthanum oxynitride, but is not limited thereto. Other materials suitable for forming the dipole layer 53 are within the contemplated scope of the present disclosure.

By controlling the dipole layer 53 to have a predetermined thickness, amounts of the first dipole elements diffusing into at least one of the interfacial layer 51 and the gate dielectric layer 52 at each of the regions n03, n02, p01, p02 can be controlled. In some embodiments, the dipole layer 53 at the third n-type region n03 has a thickness greater than that of the dipole layer 53 at the second n-type region n02, and the dipole layer 53 at the first p-type region p01 has a thickness greater than that of the dipole layer 53 at the second p-type region p02.

In some embodiments, step 104 includes sub-steps 10A to 10D.

Referring the example illustrated in FIG. 7, in sub-step 10A, at each of the first, second and third n-type regions n01, n02, n03, and the first, second and third p-type regions p01, p02, p03, a dipole sub-layer 531 is formed on the interfacial layer 51 using CVD, ALD, or other suitable deposition techniques. Suitable materials for forming the dipole sub-layer 531 are similar to those for forming the dipole layer 53, and thus details of the possible materials for the dipole sub-layer 531 are omitted for the sake of brevity. In some embodiments, the dipole sub-layer 531 has a thickness ranging from about 0.5 Å to about 25 Å.

Referring the example illustrated in FIG. 7, in sub-step 10B, at each of the first, second and third n-type regions n01, n02, n03, and the first, second and third p-type regions p01, p02, p03, a hard mask layer 54 is formed on the dipole sub-layer 531 using CVD, ALD, or other suitable deposition techniques. In some embodiments, the hard mask layer 54 includes an oxide, a nitride, a carbide, an oxynitride, an oxycarbide, a carbonitride, an oxycarbonitride, a metal-oxide, a metal-nitride, a metal-carbide, a metal-oxynitride or combinations thereof. In some embodiments, the hard mask layer 54 may be made of silicon oxide, silicon nitride, aluminum oxide, aluminum nitride, titanium nitride, silicon oxynitride, silicon carbide, or silicon oxycarbide, but is not limited thereto. Other materials suitable for forming the hard mask layer 54 are within the contemplated scope of the present disclosure. In some embodiments, the hard mask layer 54 has a thickness ranging from about 5 Å to about 50 Å.

Figures 8, 9:
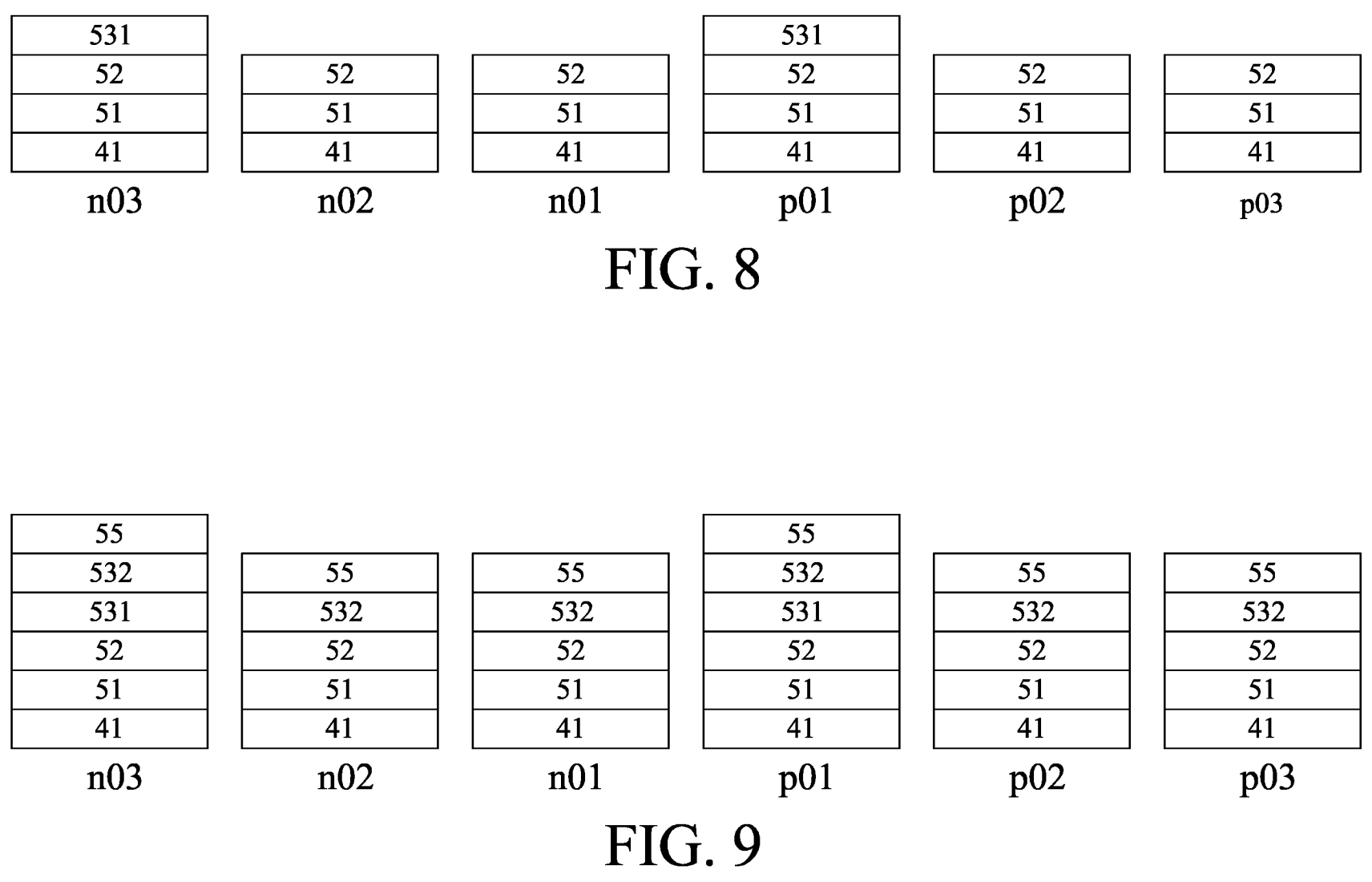

Referring the example illustrated in FIGS. 7 and 8, in sub-step 10C, the hard mask layer 54 at each of the first, second and third n-type regions n01, n02, n03 and the first, second and third p-type regions p01, p02, p03 is removed, the dipole sub-layer 531 at each of the first and second n-type regions n01, n02, and the second and third p-type regions p02, p03 is removed, while the dipole sub-layer 531 at each of the third n-type region n03 and the first p-type region p01 is retained. In some embodiments, sub-step 10C includes (i) forming a photoresist layer and/or a bottom anti-reflective coating (BARC) layer (not shown) on the hard mask layer 54 at each of the regions n01, n02, n03, p01, p02, p03 as shown in FIG. 7, using, for example, but not limited to, spin coating, (ii) patterning the photoresist layer and/or the BARC layer to expose the hard mask layer 54 at each of the regions n01, n02, p02, p03 using, for example, but not limited to, exposure and developing processes, (iii) removing the hard mask layer 54 and the dipole sub-layer 531 at each of the regions n01, n02, p02, p03 using, for example, but not limited to, a wet etching process and/or a dry etching process, (iv) removing the patterned photoresist layer and the patterned BARC layer at each of the regions n03, p01 using, for example, but not limited to, a stripping process and/or an etching process, and (v) removing the hard mask layer 54 at each of the regions n03, p01. In some embodiments, the wet etching process applied for removal of the hard mask layer 54 and the dipole sub-layer 531 at each of the regions n01, n02, p02, p03 may include use of one or more wet etchant solutions which have a higher etching selectivity (or higher etching rate) over the hard mask layer 54 and the dipole sub-layer 531 than the gate dielectric layer 52 so that the gate dielectric layer 52 located beneath the dipole sub-layer 531 at each of the regions n01, n02, p02, p03 is substantially not removed. In some embodiments, the wet etching process applied for removal of the hard mask layer 54 at each of the regions n03, p01 may include use of one or more wet etchant solutions which have a higher etching selectivity (or higher etching rate) over the hard mask layer 54 than the gate dielectric layer 52 and the dipole sub-layer 531 so that the gate dielectric layer 52 at each of the regions n01, n02, p02, p03 and the dipole sub-layer 531 located beneath the hard mask layer 54 at each of the regions n03, p01 are substantially not removed. In some embodiments, the wet etchant solution may include $NH_4OH$, $H_2SO_4$, $H_2O_2$, HCl, $H_2O$, HF, $HNO_3$, diluted HF, $O_3$, $H_3PO_4$, or the like, or combinations thereof, but is not limited thereto. Other chemical solutions suitable for removing the hard mask layer 54 and the dipole sub-layer 531 are within the contemplated scope of the present disclosure. In some embodiments, parameter(s) of the etching processes (e.g., concentration(s) of etchant(s), flow rate(s) of etchant(s), concentration ratio of etchant(s), process pressure, process temperature, substrate temperature, etchant temperature, and so on) can be adjusted so that the hard mask layer 54 and the dipole sub-layer 531 are well removed.

Referring the example illustrated in FIG. 9, in sub-step 10D, an additional dipole sub-layer 532 is formed on the structure at each of the first, second and third n-type regions n01, n02, n03, and the first, second and third p-type regions p01, p02, p03 as shown in FIG. 8 using CVD, ALD, or other suitable deposition techniques. The materials, range of thickness, and configurations for the additional dipole sub-layer 532 are similar to those for the dipole sub-layer 531, and thus details thereof are omitted for the sake of brevity.

Referring the example illustrated in FIG. 9, in sub-step 10E, a hard mask layer 55 is formed on the additional dipole sub-layer 532 at each of the first, second and third n-type regions n01, n02, n03, and the first, second and third p-type regions p01, p02, p03 using CVD, ALD, or other suitable deposition techniques. The materials, range of thickness, and configurations for the hard mask layer 55 are similar to those for the hard mask layer 54, and thus details thereof are omitted for the sake of brevity.

Referring the examples illustrated in FIGS. 9 and 10, in sub-step 10F, the hard mask layer 55 at each of the first, second and third n-type regions n01, n02, n03 and the first, second and third p-type regions p01, p02, p03 is removed, the additional dipole sub-layer 532 at each of the first n-type region n01 and the third p-type region p03 is removed, while the additional dipole sub-layer 532 at each of the second and third n-type regions n02, n03 and the first and second p-type regions p01, p02 is retained. In some embodiments, sub-step 10F includes (i) forming a photoresist layer and/or a bottom anti-reflective coating (BARC) layer (not shown) on the hard mask layer 55 at each of the regions n01, n02, n03, p01, p02, p03 as shown in FIG. 9, using, for example, but not limited to, spin coating, (ii) patterning the photoresist layer and/or the BARC layer to expose the hard mask layer 55 at each of the regions n01, p03 using, for example, but not limited to, exposure and developing processes, (iii) removing the hard mask layer 55 and the additional dipole sub-layer 532 at each of the regions n01, p03 using, for example, but not limited to, a wet etching process and/or a dry etching process, (iv) removing the patterned photoresist layer and the patterned BARC layer at each of the regions n02, n03, p01, p02 using, for example, but not limited to, a stripping process and/or an etching process, and (v) removing the hard mask layer 55 at each of the regions n02, n03, p01, p02. In some embodiments, the wet etching process applied for each of removal of the additional dipole sub-layer 532 and removal of the hard mask layer 55 may include use of a wet etchant solution similar to the wet etchant solution used in sub-step 10C, and thus details thereof are omitted for sake of the brevity.

After sub-step 10F, as shown in FIG. 10, the dipole layer 53 at each of the third n-type region n03 and the first p-type region p01 includes two sub-layers (i.e., the dipole sub-layer 531 and the additional dipole sub-layer 532), the dipole layer 53 at each of the second n-type region n02 and the second p-type region p02 includes one sub-layer (i.e., the dipole sub-layer 531). In addition, the dipole layer 53 is not formed at each of the first n-type region n01 and the third p-type region p03. In some embodiments, the number of the sub-layers (i.e., the thickness of the dipole layer 53) on the gate dielectric layer 52 at each of the regions n01, n02, n03, p01, p02, p03 can be varied according to a desired amount of the first dipole elements to be diffused into the at least one of the interfacial layer 51 and the gate dielectric layer 52 at a corresponding one of the regions n01, n02, n03, p01, p02, p03, and according to a space available for depositing film between two adjacent ones of the channel layers 41 in the patterned structure 40 (see FIGS. 2 and 3) at the corresponding one of the regions n01, n02, n03, p01, p02, p03.

In some embodiments, in the case that the dipole layer 53 is likely to decompose and release the first dipole elements from a side of the dipole layer 53 opposite to the interfacial layer 51 (i.e., outward diffusion), removal of the hard mask layer 55 at each of the regions n02, n03, p01, p02 described in sub-step 10F can be omitted. Thus, the hard mask layer 55 may be retained on the dipole layer 53 at each of the regions n02, n03, p01, p02, and may be used to stabilize chemical properties of the dipole layer 53 at each of the regions n02, n03, p01, p02 during a thermal drive-in process to be performed subsequently. For example, at each of the regions n02, n03, p01, p02, the hard mask layer 55 may prevent decomposition of the dipole layer 53 therebeneath, or prevent the first dipole elements from escaping from an outer surface of the dipole layer 53 in a direction away from the interfacial layer 51 during the thermal drive-in process. In some embodiments, the hard mask layer 55 is required to be made of a material that is chemically and thermally stable at a temperature higher than that of the thermal drive-in process, so that thermal decomposition of the hard mask layer 55 is less likely to occur, and elements or atoms in the hard mask layer 55 may not diffuse into the interfacial layer 51 during the thermal drive-in process.

Figure 11:
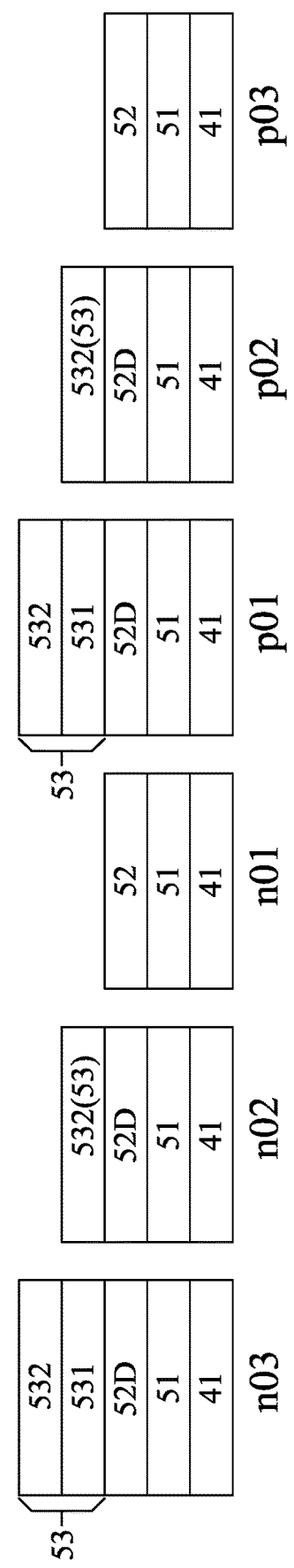

Referring to FIG. 1 and the example illustrated in FIG. 11, the method 100 proceeds to step 105, where a thermal drive-in process is performed to permit the first dipole elements in the dipole layer 53 to diffuse (be introduced) into the at least one of the interfacial layer 51 and the gate dielectric layer 52 at each of the second and third n-type regions n02, n03, and the first and second p-type regions p01, p02.

In some embodiments, the first dipole elements may be species which have a relatively low energy when located at the gate dielectric layer 52, for example, aluminum (Al), lanthanum (La), or other suitable elements. Therefore, the first dipole elements may diffuse into and stabilize in the gate dielectric layer 52 during the thermal drive-in process such that the gate dielectric layer 52 at each of the regions n02, n03, p01, p02 is formed into doped gate dielectric layer 52D including the first dipole elements.

In some embodiments, by controlling parameters (for example, but not limited to, temperature and time period) of the thermal drive-in process, the first dipole elements may diffuse into and stabilize at a bottommost region of the doped gate dielectric layer 52D, where the bottommost region is a region in direct contact with the interfacial layer 51. In this case, an atomic concentration of the first dipole elements in the bottommost region of the doped gate dielectric layer 52D may be higher than that in each of the interfacial layer 51 and a remaining region of the doped gate dielectric layer 52D. In some embodiments, at least one of the first dipole elements may be covalently bonded to oxygen atoms which originally are covalently bonded to the metal elements (e.g., Hf) of the gate dielectric layer 52.

In some embodiments, as shown in FIG. 11, the first dipole elements in the doped gate dielectric layer 52D at the third n-type region n03 have an atomic concentration greater than that in the doped gate dielectric layer 52D at the second n-type region n02, and the first dipole elements in the doped gate dielectric layer 52D at the second n-type region n02 have an atomic concentration greater than that in the gate dielectric layer 52 at the first n-type region n01. The first dipole elements in the doped gate dielectric layer 52D at the first p-type region p01 have an atomic concentration greater than that in the doped gate dielectric layer 52D at the second p-type region p02, and the first dipole elements in the doped gate dielectric layer 52D at the second p-type region p02 have an atomic concentration greater than that in the gate dielectric layer 52 at the third p-type region p03. In some embodiments, for each of the regions n02, n03, p01, p02, an atomic concentration of the first dipole elements in the interfacial layer 51 and the doped gate dielectric layer 52D ranges from 0.5% to 25%.

In some embodiments, the thermal drive-in process may be performed using a rapid thermal annealing (RTA) process, a furnace annealing process, a laser spike annealing process (LSA), or combinations thereof. Other suitable thermal annealing processes for facilitating diffusion of the first dipole elements are within the contemplated scope of the present disclosure. In some embodiments, the thermal drive-in process may be performed at a temperature ranging from about 500° C. to about 850° C. for a time period ranging from about 1 second to about 180 seconds. It is noted that the above process parameters may be adjusted according to different thermal processes to well control diffusion of the first dipole elements.

For purposes of simplicity and clarity, hereinafter, the doped gate dielectric layer 52D at each of the regions n02, n03, p01, p02 may also be referred to as a gate dielectric layer.

Referring to FIG. 1 and the examples illustrated in FIGS. 11 and 12, the method 100 proceeds to step 106, where the dipole layer 53 is removed from the structure at each of the second and third n-type regions n02, n03, and the first and second p-type regions p01, p02 as shown in FIG. 11, using, for example, but not limited to, a wet etching process or a dry etching process. In some embodiments, in the case that the hard mask layer 55 is present at each of the regions n02, n03, p01, p02 during the thermal drive-in process, the hard mask layer 55 at each of the regions n02, n03, p01, p02 may be removed along with the dipole layer 53 in this step.

In some embodiments, the wet etching process applied for removal of the dipole layer 53 may include use a wet etchant solution which has a higher etching selectivity (or higher etching rate) over the dipole layer 53 than the gate dielectric layer 52, 52D at each of the regions n01, n02, n03, p01, p02, p03 so that the gate dielectric layer 52, 52D at each of the regions n01, n02, n03, p01, p02, p03 is substantially not removed or damaged. In some embodiments, the wet etchant solution may be similar to the wet etchant solution used in sub-step 10C but parameter(s) of the etching process (e.g., concentration(s) of etchant(s), flow rate(s) of etchant(s), concentration ratio of etchants(s), process pressure, process temperature, substrate temperature, etchant temperature, and so on) is tunable to achieve removal of the dipole layer 53. Other chemical solutions suitable for removing the dipole layer 53 are within the contemplated scope of the present disclosure.

Referring to FIG. 1 and the example illustrated in FIG. 13, the method 100 proceeds to step 107, where a dipole layer 56 is formed on the gate dielectric layer 52, 52D at each of the first, second and third n-type regions n01, n02, n03, and the first, second and third p-type regions p01, p02, p03 as shown in FIG. 12, using CVD, ALD, or other suitable deposition techniques. The dipole layer 56 serves as a source that provides second dipole elements to be diffused into at least one of the interfacial layer 51 and the gate dielectric layer 52, 52D, and thus the dipole layer 56 includes the second dipole elements. In some embodiments, the second dipole elements includes zinc (Zn), gallium (Ga), lanthanum (La), magnesium (Mg), aluminum (Al), or combinations thereof. The second dipole elements are elements different from the first dipole elements. For example, when zinc is selected as the second dipole elements, the dipole layer 56 may be made of zinc oxide, zinc nitride, zinc oxynitride, but is not limited thereto. The materials, range of thickness, and configurations for the dipole layer 56 are similar to those for the dipole layer 53, and thus details thereof are omitted for the sake of brevity.

In some embodiments, the dipole layer 56 at each of the regions n01, n02, n03, p01, p02, p03 as shown in FIG. 13 has the same thickness. For example, the dipole layer 56 at each of the regions n01, n02, n03, p01, p02, p03 includes one sub-layer (i.e., dipole sub-layer). In some other not shown embodiments, the dipole layer 56 at each of the regions n01, n02, n03, p01, p02, p03 may have different thickness, for example, but not limited to, by controlling the number of the dipole sub-layer(s) deposited on the gate dielectric layer 52, 52D so that amounts of the second dipole elements diffusing into at least one of the interfacial layer 51 and the gate dielectric layer 52, 52D at each of the regions n01, n02, n03, p01, p02, p03 can be controlled. The formation of the dipole layer 56 with different number of the dipole sub-layer may be similar to those described in step 104, and thus the details thereof are omitted for the sake of brevity.

Referring to FIG. 1 and the example illustrated in FIG. 13, the method 100 proceeds to step 108, where a hard mask layer 57 is formed on the dipole layer 56 at each of the first, second and third n-type regions n01, n02, n03, and the first, second and third p-type regions p01, p02, p03, using CVD, ALD, or other suitable deposition techniques. The hard mask layer 57 is provided to stabilize chemical properties of the dipole layer 56 at each of the regions n01, n02, n03, p01, p02, p03 during a thermal drive-in process to be performed subsequently. The materials, range of thickness, and configurations for the hard mask layer 57 are similar to those for the hard mask layer 55, and thus details thereof are omitted for the sake of brevity. In the case that the dipole layer 56 is less likely to decompose and release the second dipole elements from a side of the dipole layer 56 opposite to the interfacial layer 51, deposition of the hard mask layer 57 can be omitted.

Figure 14:
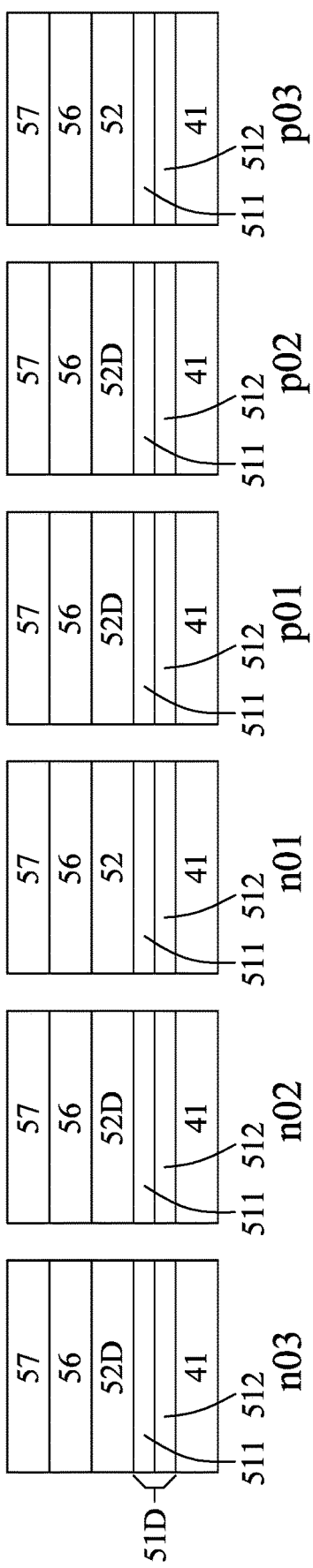
Figure 15:
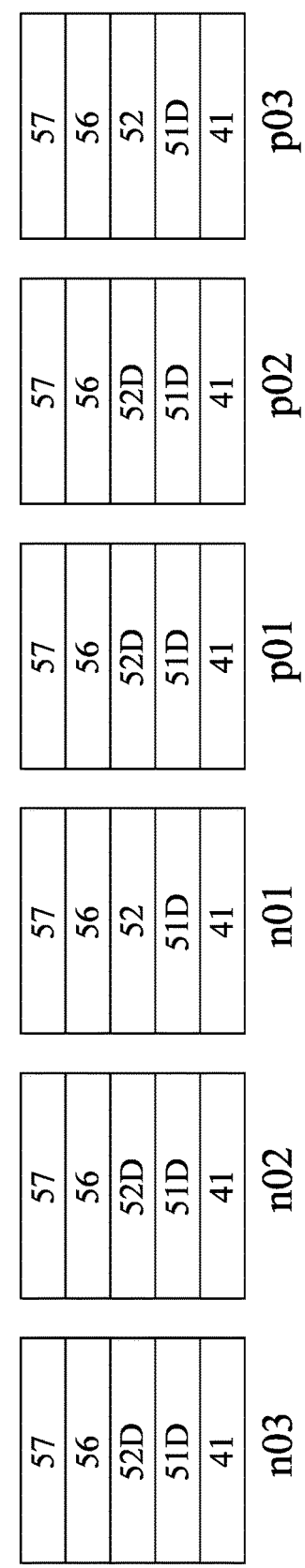

Referring to FIG. 1 and the examples illustrated in FIGS. 14 and 15, the method 100 proceeds to step 109, where a thermal drive-in process is performed to permit the second dipole elements in the dipole layer 56 to diffuse (be introduced) into at least one of the interfacial layer 51 and the gate dielectric layer 52, 52D in a predetermined amount at each of the first, second and third n-type regions n01, n02, n03, and the first, second and third p-type regions p01, p02, p03 such that the semiconductor device 30 (see FIG. 20) has a predetermined threshold voltage.

In some embodiments, the second dipole elements may be species which have a relatively low energy when located at the interfacial layer 51, for example, zinc (Zn), or other suitable elements. Therefore, the second dipole elements may diffuse into and stabilize in the interfacial layer 51 during the thermal drive-in process such that the interfacial layer 51 at each of the regions n01, n02, n03, p01, p02, p03 is formed into doped interfacial layer 51D including the second dipole elements.

When the second dipole elements are present in the doped interfacial layer 51D, a dielectric constant (k) value of the doped interfacial layer 51D may increase relative to that of an un-doped interfacial layer, and a total capacitance equivalent thickness (CET) of the gate dielectric layer 52, 52D and the doped interfacial layer 51D may decrease relative to that of the gate dielectric layer 52, 52D and the un-doped interfacial layer. Therefore, introduction of the second dipole elements makes it possible to increase a total physical thickness of the gate dielectric layer 52, 52D and the doped interfacial layer 51D so as to reduce a gate leakage current (Jg) of the semiconductor device 30 (see FIG. 20) without increasing the total CET value thereof.

In some embodiments, an atomic concentration of the second dipole elements may be a relatively low value. For each of the regions n01, n02, n03, p01, p02, p03, an atomic concentration of the second dipole elements in the doped interfacial layer 51D and the gate dielectric layer 52, 52D may range from 0.1% to 10%. In some other embodiments, the atomic concentration of the second dipole elements may be a relatively high value. For each of the regions n01, n02, n03, p01, p02, p03, an atomic concentration of the second dipole elements in the doped interfacial layer 51D and the gate dielectric layer 52, 52D may range from 0.1% to 80%.

In some embodiments, as shown in FIG. 14, by controlling parameters (for example, but not limited to, temperature and time period) of the thermal drive-in process, the second dipole elements may be present in an uppermost region 511 of the doped interfacial layer 51D, where the uppermost region 511 is a region in direct contact with the gate dielectric layer 52, 52D. In other words, for each of the regions n01, n02, n03, p01, p02, p03, an atomic concentration of the second dipole elements in the uppermost region 511 of the doped interfacial layer 51D may be higher than that in each of the gate dielectric layer 52, 52D and a remaining region 512 of the doped interfacial layer 51D.

In some embodiments, at least one of the second dipole elements may be covalently bonded to oxygen atoms which are originally covalently bonded to the silicon atoms of the interfacial layer 51, and a portion of the silicon atoms which are originally located at the uppermost region 511 may move to and recrystallize in the remaining region 512. In some embodiments, the uppermost region 511 of the doped interfacial layer 51D may have a metal silicate including the second dipole elements. Since the metal silicate is a relatively stable structure with respect to that of silicon sub-oxide (SiOx, where x<2) of the interfacial layer 51, it is believed that through introduction of the second dipole elements in the doped interfacial layer 51D, extra energy states induced by silicon sub-oxide (SiOx, x<2) of the interfacial layer 51 may be reduced, thereby improving time-dependent dielectric breakdown (pTDDB) reliability.

In some other embodiments, as shown in FIG. 15, the metal silicate including the second dipole elements are distributed in the entire doped interfacial layer 51D. Therefore, a dielectric constant (k) value of the doped interfacial layer 51D may be significantly increased, and a total CET value may be significantly reduced. Furthermore, the time-dependent dielectric breakdown (pTDDB) reliability of the semiconductor device 30 (see FIG. 20) may be greatly improved.

In some embodiments, an atomic concentration of the second dipole elements in the doped interfacial layers 51D at the regions n01, n02, n03, p01, p02, p03 shown in FIG. 14 is the same. Likewise, in some embodiments, the atomic concentration of the second dipole elements in the doped interfacial layers 51D at the regions n01, n02, n03, p01, p02, p03 shown in FIG. 15 is the same. In some other not shown embodiments, by controlling the thickness of the dipole layer 56 at each of the regions n01, n02, n03, p01, p02, p03, an atomic concentration of the second dipole elements in the doped interfacial layer 51D at one of the regions n01, n02, n03, p01, p02, p03 may be different from that of the second dipole elements in the doped interfacial layer 51D at the other one of the regions n01, n02, n03, p01, p02, p03. For example, but not limited to, when the dipole layer 56 is present on the gate dielectric layer 52 at the third p-type region p03 but not present on the gate dielectric layer 52, 52D at each of the region n01, n02, n03, p01, p02 during the thermal drive-in process, an atomic concentration of the second dipole elements in the doped interfacial layer 51D at the third p-type region p03 may be higher than that of the second dipole elements in the doped interfacial layer 51D at each of the regions n01, n02, n03, p01, p02.

In some embodiments, the second dipole elements may be species which are able to be effectively driven through the gate dielectric layer 52, 52D to the interfacial layer 51. Therefore, the thermal drive-in process to diffuse the second dipole elements may be performed using procedures that are similar to those of the thermal drive-in process in step 105, but parameter(s) of the thermal drive-in process (e.g., temperature and time period) is tunable such that the second dipole elements achieve a desired position in the doped interfacial layer 51D, reducing over-diffusion of the second dipole elements to an interface between the doped interfacial layer 51D and the channel layer 41. Other suitable thermal annealing processes for facilitating diffusion of the second dipole elements are within the contemplated scope of the present disclosure. In some embodiments, the thermal drive-in process may be performed at a temperature ranging from about 350° C. to about 1000° C. for a time period ranging from about 1 second to about 180 seconds. It is noted that the above process parameters may be adjusted according to different thermal processes such that diffusion of the second dipole elements is well controlled. For the sake of brevity, the configuration of FIG. 14 will be used for illustration in the subsequent steps.

Figure 16:
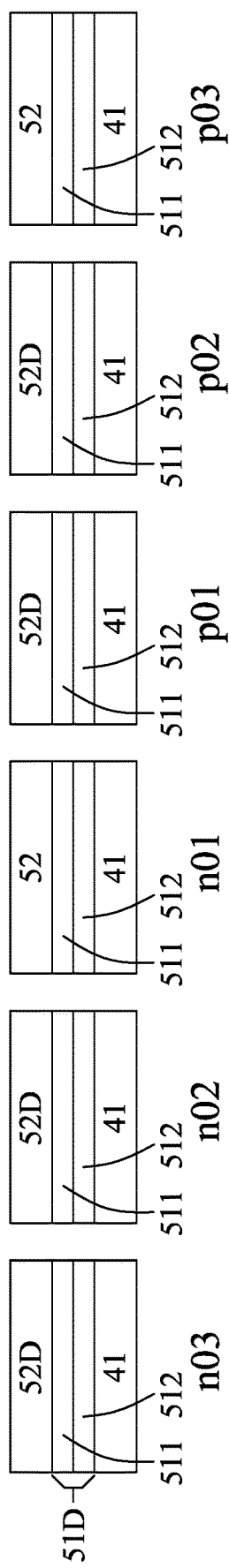

Referring to FIG. 1 and the examples illustrated in FIGS. 14 and 16, the method 100 proceeds to step 110, where the hard mask layer 57 and the dipole layer 56 at each of the first, second and third n-type regions n01, n02, n03, the first, second and third p-type regions p01, p02, p03 are removed, using, for example, but not limited to, a wet etching process and/or a dry etching process. In some embodiments, the wet etching process applied for removal of the hard mask layer 57 and the dipole layer 56 may include use one or more wet etchant solutions which have a higher etching selectivity (or higher etching rate) over the hard mask layer 57 and the dipole layer 56 than the gate dielectric layer 52, 52D at each of the regions n01, n02, n03, p01, p02, p03 so that the gate dielectric layer 52, 52D located beneath the dipole layer 56 at each of the regions n01, n02, n03, p01, p02, p03 is substantially not removed or damaged. In some embodiments, the wet etchant solution(s) may be similar to the wet etchant solution used in sub-step 10C but parameter(s) of the etching process (e.g., concentration(s) of etchant(s), flow rate(s) of etchant(s), concentration ratio of etchant(s), process pressure, process temperature, substrate temperature, etchant temperature, and so on) is tunable to achieve removal of the hard mask layer 57 and the dipole layer 56. Other chemical solutions suitable for removing the hard mask layer 57 and the dipole layer 56 are within the contemplated scope of the present disclosure.

Figure 17:
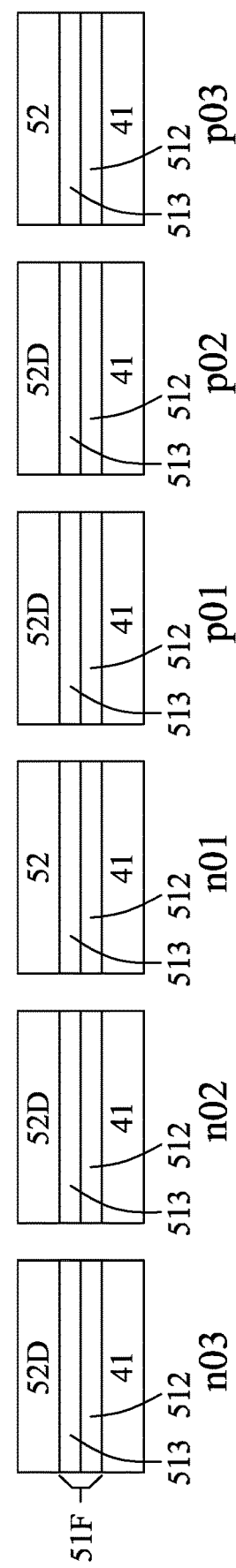

Referring to FIG. 1 and the example illustrated in FIGS. 16 and 17, the method 100 proceeds to step 111, where additional elements including fluorine (F), the isotopes of fluorine, or combinations thereof (hereinafter referred to as F elements) are introduced into a region 511 where the second dipole elements are introduced so as to reduce interfacial defects caused by the introduction of the second dipole elements. To be specific, in some embodiments, the interfacial defects may be resulted from an uneven electron cloud formed around the second dipole elements in the doped interfacial layer 51D, and may affect transport of major carriers in the channel layer 41 beneath the doped interfacial layer 51D since the major carriers may be trapped by the interfacial defects. Through introduction of the F elements, the uneven electron cloud formed around the second dipole may become more symmetric, thereby reducing the interfacial defects.

In some embodiments, when the second dipole elements are present in the uppermost region 511 of the doped interfacial layer 51D at each of the first, second and third n-type regions n01, n02, n03, the first, second and third p-type regions p01, p02, p03 as shown in FIG. 16, the F elements may be introduced into the uppermost region 511 of the doped interfacial layer 51D and may bond to the second dipole elements. Thus, the uppermost region 511 shown in FIG. 16 is formed into an F-containing region 513 as shown in FIG. 17, and the doped interfacial layer 51D shown in FIG. 16 is formed into an F-containing interfacial layer 51F including the F-containing region 513 and the remaining region 512 (see FIG. 17). An atomic concentration of the F elements in the F-containing region 513 is higher than that in the remaining region 512. In some embodiments, for each of the regions n01, n02, n03, p01, p02, p03, an atomic concentration of the F elements in the F-containing interfacial layer 51F and the gate dielectric layer 52, 52D ranges from about 0.1% to about 10%.

In some embodiments, when the second dipole elements are uniformly distributed in the entire doped interfacial layer 51D at each of the regions n01, n02, n03, p01, p02, p03 as shown in FIG. 15, the F elements may be introduced into the entire doped interfacial layer 51D, and may be bonded to the second dipole elements. In this case, the entire doped interfacial layer 51D is thus formed into the F-containing interfacial layer 51F. In some embodiments, for each of the regions n01, n02, n03, p01, p02, p03, an atomic concentration of the F elements in the F-containing interfacial layer 51F and the gate dielectric layer 52, 52D ranges from about 0.1% to about 80%.

In some other not shown embodiments, when the second dipole elements are present in the interfacial layer at the third p-type region p03, but not at each of the regions n01, n02, n03, p01, p02, in addition to the region p03, the F elements may be also introduced into the interfacial layer at each of the regions n01, n02, n03, p01, p02. In this case, the introduction of fluorine is performed without forming a photoresist layer to cover each of the regions n01, n02, n03, p01, p02.

In some embodiments, introduction of the F elements may include subjecting the structure as shown in FIG. 16 to a F-containing plasma so as to increase amount of the F elements in the doped interfacial layer 51D. In some embodiments, the F-containing plasma may be generated by a F-containing precursor gas including $SF_6$, $CF_4$, $CH_3F$, $CH_2F_2$, other suitable precursor gas, or combinations thereof, through a plasma generator, for example, but not limited to, an inductively-coupled plasma (ICP) generator, a capacitively-coupled plasma (CCP) generator, an electron cyclotron resonance (ECR) plasma generator, or other suitable plasma generators. In some embodiments, a carrier gas, for example, but not limited to, oxygen gas ($O_2$), may be provided along with the F-containing precursor gas so as to adjust the concentration of the F-containing plasma in a reaction chamber for the plasma process. In some embodiments, an annealing process may be performed after introduction of the F elements, or introduction of the F elements may be performed at a relatively high temperature, so as to permit the F elements in the F-containing interfacial layer 51F to be bonded to the second dipole elements, and so as to permit the electron cloud formed around the second dipole elements to become symmetric, thereby reducing the interfacial defects. Several parameter(s) of the plasma treatment (e.g., flow rate of the F-containing precursor gas, RF power of the plasma generator, process temperature, time period and so on) and the annealing process (e.g., temperature, time period and so on) are adjustable to control characteristics (e.g., concentration, position, and so on) of the F elements in the F-containing interfacial layer 51F. Other suitable processes for introducing the F elements are within the contemplated scope of the present disclosure.

Figure 18:
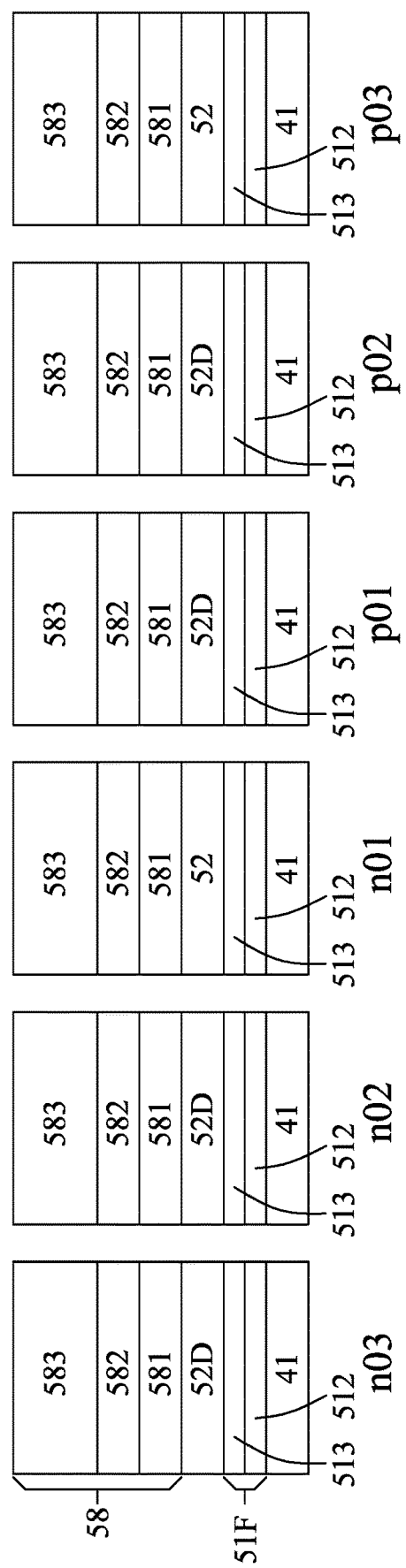

Referring to FIG. 1 and the example illustrated in FIG. 18, the method 100 proceeds to step 112, where a gate electrode 58 is formed on the gate dielectric layer 52, 52D at each of the first, second and third n-type regions n01, n02, n03 and the first, second and third p-type regions p01, p02, p03. In some embodiments, the gate electrode 58 may be configured as a single-layer structure or a multi-layered structure. In some embodiments, the gate electrode 58 may include at least one work function metal layer 581, a glue layer 582, and a metal filling layer 583. In some embodiments, the at least one work function metal layer 581 is provided for adjusting threshold voltage of the semiconductor devices 30 (see FIG. 20). In some embodiments, the at least one work function metal layer 581 may have a mid-gap work function, that is, the at least one work function metal layer 581 has a Fermi-energy level that is close to half of energy levels of a conduction band edge and a valance band edge of the channel layer 41. In some embodiments, the at least one work function metal layer 581 may be made of titanium nitride (TiN), tantalum nitride (TaN), titanium aluminide (TiAl), titanium aluminum carbide (TiAlC), titanium aluminum carbon nitride (TiAlCN), or combinations thereof. Other suitable materials for forming the work function metal layer 581 are within the contemplated scope of the present disclosure. In some embodiments, the work function metal layer 581 has a thickness ranging from about 10 Å to about 50 Å. In some embodiments, the glue layer 582 is optional, but is often used to provide a desired adhesion to the metal filling layer 583 to be formed thereon. In some embodiments, the glue layer 582 includes nitride-based materials, such as titanium nitride (TiN), tantalum nitride (TaN), tungsten nitride (WN), or combinations thereof. Other suitable materials for forming the glue layer 582 are within the contemplated scope of the present disclosure. In some embodiments, the glue layer 582 has a thickness ranging from about 10 Å to about 100 Å. In some embodiments, the metal filling layer 583 is provided for reducing electrical conductivity of the gate electrode 58, and includes a low conductivity metal, such as tungsten (W), cobalt (Co), ruthenium (Ru), iridium (Ir), alloy thereof, or combinations thereof. Other suitable materials for forming the metal filling layer 583 are within the contemplated scope of the present disclosure. In some embodiments, the metal filling layer 583 has a thickness ranging from about 30 Å to about 1000 Å. In some embodiments, the gate electrodes 58 of the semiconductor device 30 at the regions n01, n02, n03, p01, p02, p03 have the same thickness or the same configuration. In some embodiments, the gate electrodes 58 of the semiconductor devices 30 at the regions n01, n02, n03, p01, p02, p03 have the thickness or the configuration different from each other. For example, in some embodiments, the work function metal layer 581 at the regions n01, n02, n03 may be made of material(s) different from that of the work function metal layer 581 at the regions p01, p02, p03. In some embodiments, step 112 includes (i) depositing materials for forming the work function metal layer(s) 581 to fill the cavities 48 (see FIG. 2) of the patterned structures 40 obtained after step 111 using CVD, ALD or other suitable processes, (ii) etching back the materials for forming the work function metal layer(s) 581 to form recesses (not shown) using, for example, but not limited to, a dry etching process, (iii) sequentially depositing materials for forming the glue layer 582, and the metal filling layer 583 using CVD, ALD or other suitable processes to fill the recesses, and (ii) performing a planarization process, for example, but not limited to, CMP or other suitable processes, thereby obtaining the work function metal layer(s) 581, the glue layer 582, and the metal filling layer 583.

Referring to FIG. 1 and the example illustrated in FIGS. 18 and 19, the method 100 proceeds to step 113, where additional elements including hydrogen (H) and the isotopes of hydrogen (hereinafter referred to as H elements) are introduced into a region 513 where the second dipole elements are introduced so as to reduce interfacial defects caused by the introduction of the second dipole elements. To be specific, in some embodiments, the interfacial defects may be resulted from a high bond angle of O—Zn—O which is greater than a bond angle of O—Si—O. After introduction of the H elements, the bond angle of O—Zn—O may be reduced to a value which is close to the bond angle of O—Si—O, thereby reducing the interfacial defects.

In some embodiments, when the second dipole elements are present in the F-containing region 513 of the F-containing interfacial layer 51F at each of the first, second and third n-type regions n01, n02, n03, and the first, second and third p-type regions p01, p02, p03 as shown in FIG. 18, the H elements may be introduced into the F-containing region 513 of the F-containing interfacial layer 51F, and may be bonded to the oxygen atoms in the F-containing region 513. Thus, the F-containing region 513 in FIG. 18 is formed into an H-containing region 514 in FIG. 19, and the F-containing interfacial layer 51F in FIG. 18 is formed into an H-containing interfacial layer 51H including the H-containing region 514 and the remaining region 512 (see FIG. 19). An atomic concentration of the H elements in the H-containing region 514 is higher than that in the remaining region 512. In some embodiments, for each of the regions n01, n02, n03, p01, p02, p03, an atomic concentration of the H elements in the H-containing interfacial layer 51H and the gate dielectric layer 52, 52D ranges from about 0.1% to about 10%.

In some embodiments, when the second dipole elements are uniformly distributed in the entire doped interfacial layer 51F at each of the regions n01, n02, n03, p01, p02, p03 as shown in FIG. 18, the H elements may be introduced into the entire doped interfacial layer 51F, and may be bonded to the oxygen in the doped interfacial layer 51F. In this case, the entire doped interfacial layer 51F is thus formed into the H-containing interfacial layer 51H. In some embodiments, for each of the regions n01, n02, n03, p01, p02, p03, an atomic concentration of the H elements in the H-containing interfacial layer 51H and the gate dielectric layer 52, 52D ranges from about 0.1% to about 80%.

In some other not shown embodiments, when the second dipole elements are present in the interfacial layer at the third p-type region p03, but not in the interfacial layer 51 at each of the regions n01, n02, n03, p01, p02, in addition to the region p03, the H elements may be also introduced into the interfacial layer 51 at each of the regions n01, n02, n03, p01, p02.

In some embodiments, introduction of the H elements may be performed at a temperature ranging from about 300° C. to about 600° C. in an ambient atmosphere containing hydrogen, deuterium, or a combination thereof, under a pressure ranging from about 1 atm to about 20 atm, so as to drive hydrogen and/or deuterium into the structure as shown in FIG. 18 and toward the F-containing interfacial layer 51F. The above process parameters may be adjusted to control concentration of the H elements in the H-containing interfacial layer 51H. Other suitable processes for introducing the H elements are within the contemplated scope of the present disclosure.

After step 113, the semiconductor devices 30 formed at the regions n01, n02, n03, p01, p02, p03 are obtained. FIG. 20 is a schematic sectional view of one of the semiconductor devices 30 in accordance with some embodiments. FIG. 21 is a schematic sectional view of the one of the semiconductor devices 30 taken long line D-D' of FIG. 20. FIG. 19 is a schematic view illustrating regions EE of the semiconductor devices 30 (each being shown in FIG. 20) or regions FF of the semiconductor devices 30 (each being shown in FIG. 21). Please note that although the gate dielectric layer 52 shown in FIGS. 20 and 21 and obtained in step 105 may be one of the gate interfacial layers 52, 52D as shown in FIG. 19, the gate dielectric layer 52 as shown in FIGS. 20 and 21 is denoted by numeral 52 for simplified illustration.

Figure 19:
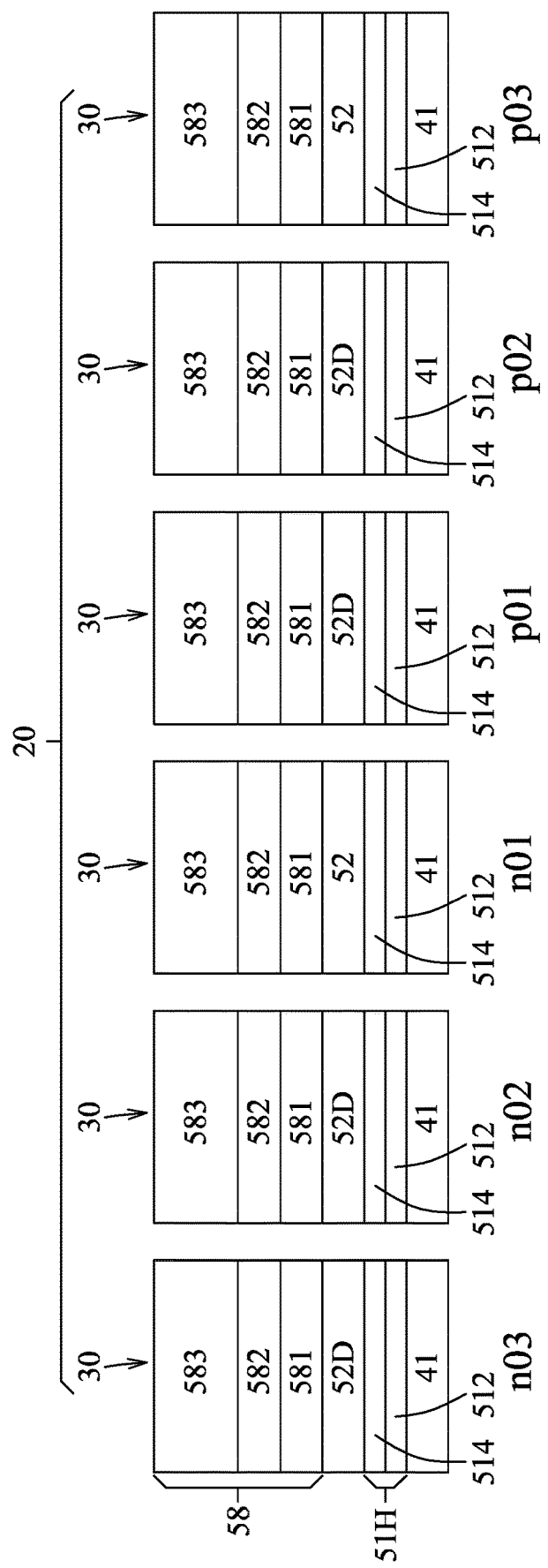
Figure 20:
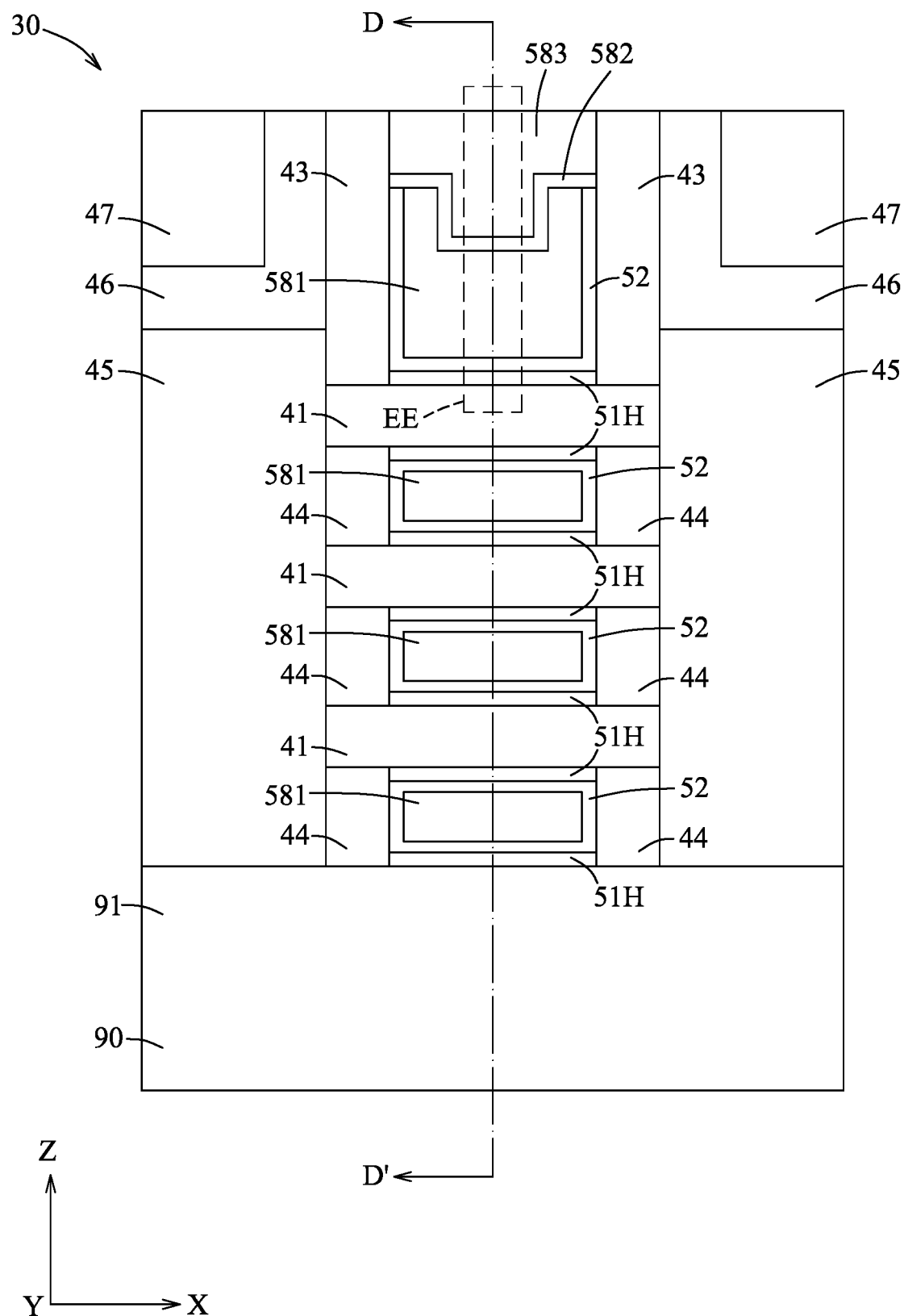
Figure 21:
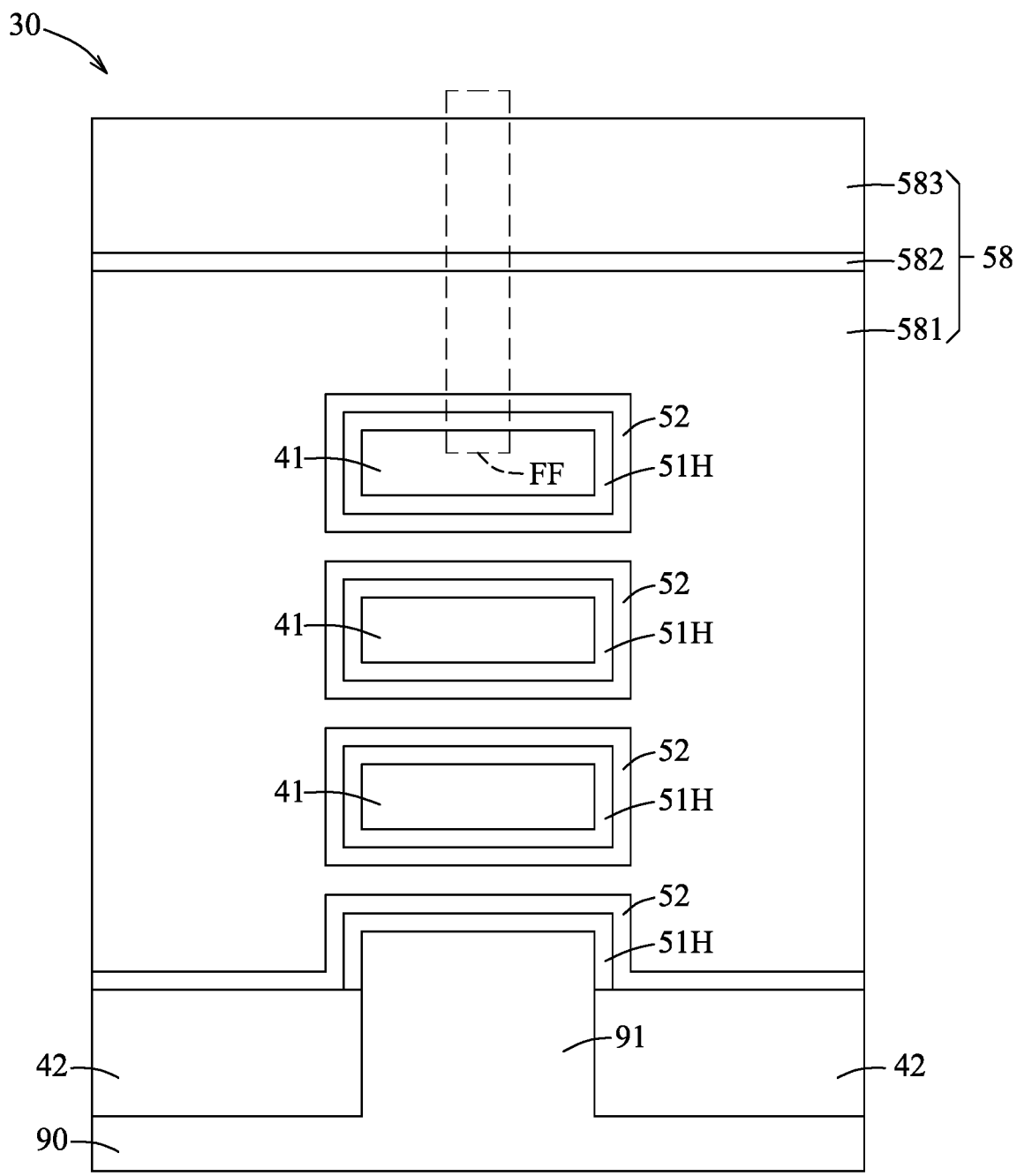

Referring to FIG. 19, since the semiconductor devices 30 (one of which is shown in FIGS. 20 and 21) at the first, second and third n-type regions n01, n02, n03 are n-FETs, threshold voltage (Vt) values for the semiconductor devices 30 at the regions n01, n02, n03 are positive. In the case that the first dipole elements are La (or Mg) and that the second dipole elements are Zn (or Ga), according to atomic concentration of the first dipole elements in the gate dielectric layer 52, 52D at each of the regions n01, n02, n03 (i.e., the atomic concentration of the first dipole elements in the gate dielectric layer: n03>n02>n01) and atomic concentration of the second dipole elements in the doped interfacial layer 51D at each of the regions n01, n02, n03 (i.e., the atomic concentration of the first dipole elements in the doped interfacial layer: n03=n02=n01), the semiconductor device 30 at the region n03 would have a lower Vt value than that of the semiconductor device 30 at the region n02, and the semiconductor device 30 at the region n02 would have a lower Vt value than that of the semiconductor device 30 at the region n01 (i.e., the Vt value: n03<n02<n01).

Since the semiconductor devices 30 at the first, second and third n-type regions p01, p02, p03 are p-FETs, Vt values for the semiconductor devices 30 at the regions p01, p02, p03 are negative. In the case that the first dipole elements are La (or Mg) and that the second dipole elements are Zn (or Ga), according to atomic concentration of the first dipole elements in the gate dielectric layer 52, 52D at each of the regions p01, p02, p03 (i.e., the atomic concentration of the first dipole elements in the gate dielectric layer: p03<p02<p01) and atomic concentration of the second dipole elements in the doped interfacial layer 51D at each of the regions p01, p02, p03 (i.e., the atomic concentration of the first dipole elements in the doped interfacial layer: p03=p02=p01), the semiconductor device 30 at the region p01 would have a lower Vt value than that of the semiconductor device 30 at the region p02 (i.e., the Vt value at the region p01 is more negative than that at the region p02), and the semiconductor device 30 at the region p02 would have a lower Vt value than that of the semiconductor device 30 at the region p03 (i.e., the Vt value at the region p02 is more negative than that at the region p03). That is, the Vt value: p01<p02<p03.

In some embodiments, some steps in the method 100 may be modified, replaced, or eliminated without departure from the spirit and scope of the present disclosure. For example. For example, in some embodiments, the gate dielectric layer 52 may be formed in multiple times (i.e., the gate dielectric layer 52 may include two or more sub-layers).

In some embodiments, the method 100 may further include an extra thermal annealing process, which may be referred to as a reliability anneal, for reducing defects and improving reliability of the semiconductor devices 30. The reliability anneal may be performed using a rapid thermal annealing (RTA) process, a furnace annealing process, a laser spike annealing process (LSA), or other suitable processes. In some embodiments, the reliability anneal may be performed at a temperature ranging from about 600° C. to about 1000° C. for a time period ranging from about 0.1 second to about 60 seconds. However, in the case that the entire semiconductor structure 20 is heated up during the reliability anneal, the second dipole elements present in the uppermost region 511 of the doped interfacial layer 51D may over-diffuse to an interface between the channel layer 41 and the doped interfacial layer 51D, thereby inducing interfacial defects. Therefore, in some embodiments, the reliability anneal may be performed before introduction of the second dipole elements (i.e., steps 107 to 109) so as to alleviate over-diffusion of the second dipole elements. In some embodiments, reduction of temperature of the reliability anneal may be also prevent the second dipole elements from over-diffusion.

In the following description, a thermal drive-in process other than using a rapid thermal annealing (RTA) process, a furnace annealing process, a laser spike annealing process (LSA) as abovementioned in steps 105 and 109 for selectively heating the dipole layers 53, 56 is provided so as to precisely control diffusion of the second dipole elements.

Figure 22:
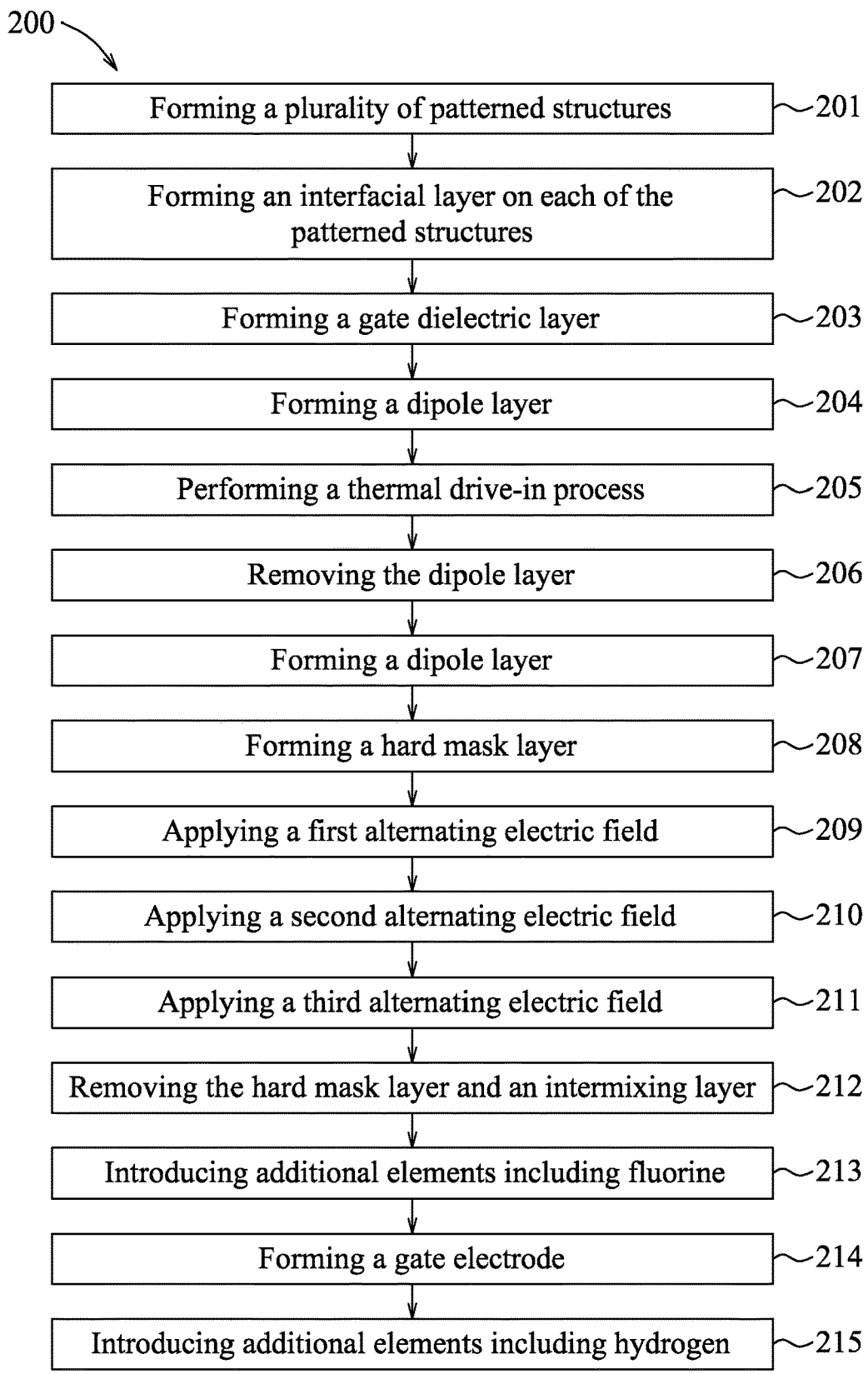
FIG. 22 is a flow diagram illustrating another method for manufacturing a semiconductor structure in accordance with some embodiments.

FIG. 22 is a flow diagram illustrating a method 200 for manufacturing a semiconductor structure (for example, the semiconductor structure 20 shown in FIG. 19) in accordance with some embodiments. FIGS. 23 to 27 illustrate schematic views of intermediate stages of the method 200 in accordance with some embodiments. The method includes steps 201 to 215, where steps 201 to 208 are similar to steps 101 to 108 described above with reference to FIGS. 4 to 13, steps 212 to 215 are similar to steps 110 to 113 described above with reference to FIGS. 16 to 19, and thus details thereof are omitted for the sake of brevity. It is noted that similar numerals from the above-mentioned embodiments have been used where appropriate, with some construction differences being indicated with different numerals.

Figure 23:
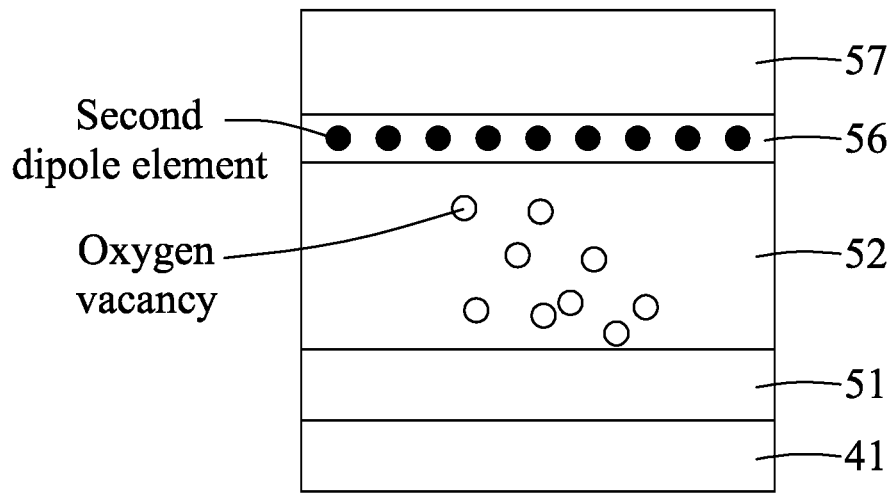
FIGS. 23 to 27 illustrate schematic views of the intermediate stages of the method depicted in FIG. 22 in accordance with some embodiments.

FIG. 23 is a view similar to that of FIG. 13, but for purposes of simplicity and clarity, the structure at the first n-type region n01 is shown and described below, while the structures at the other region n02, n03, p01, p02, p03 are omitted.

Figure 24:
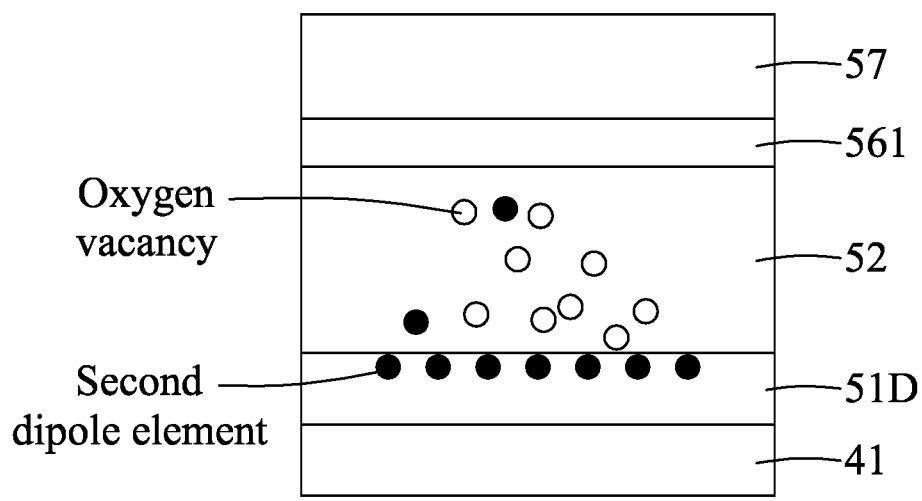

Referring to FIG. 22 and the example illustrated in FIG. 24, the method 200 proceeds to step 209, where a first alternating electric field (e.g., a first electromagnetic radiation) with a first selected frequency is applied to the structure shown in FIG. 23 to selectively heat the dipole layer 56 so as to permit the second dipole elements in the dipole layer 56 to be driven into the interfacial layer 51, thereby obtaining the doped interfacial layer 51D. FIG. 24 is a view similar to that of FIG. 23, but illustrating the structure after step 209. A frequency of an alternating electric field determines a time rate of change of the electric field in terms of direction.

As abovementioned in step 107, the dipole layer 56 may be made of a dielectric material in accordance with some embodiments. The dielectric material may have a permittivity ($\varepsilon$) which has a real component (dielectric constant, $\varepsilon'$) and an imaginary component (dielectric loss factor, $\varepsilon''$).

The dielectric constant ($\varepsilon'$) reflects extent of polarization (i.e., a dipole moment value induced by an alternating electric field) of the dielectric material. When a frequency of the alternating electric field is increased to a relaxation frequency ($f_r$), the polarization of the dipoles in the dielectric material (e.g., rotation or alignment of the dipoles) cannot catch up with the alternating electric field, and the dielectric constant ($\varepsilon'$) will decrease accordingly. This is the so-called relaxation phenomenon.

The dielectric loss factor ($\varepsilon''$) reflects ability to convert energy of an electromagnetic radiation into heat, and may increase to a maximum value at the relaxation frequency ($f_r$).

The loss tangent (tan $\delta$) is obtained by a ratio of the dielectric loss factor ($\varepsilon''$) to the dielectric constant ($\varepsilon'$) (i.e., tan $\delta=\varepsilon''/\varepsilon'$), and reaches a maximum value around the relaxation frequency ($f_r$). The higher the loss tangent (tan $\delta$), the more difficult the dipoles in the dielectric material are to align themselves with the alternating electric field.

It is found that the dielectric material can be effectively heated at a predetermined range of frequency where the loss tangent (tan $\delta$) has a relatively large value. This is the so-called dielectric heating. It is noted that the predetermined range frequency of the dielectric material may vary according to a thickness, a grain size, a film quality, a film density, or other properties of the dielectric material.

In some embodiments, the dipole layer 56 is selectively heated, and in some other embodiments, other dielectric materials (such as the interfacial layer 51, the gate dielectric layer 52, and the dipole layer 53, which are also made of dielectric materials as described above in steps 102, 103, 104) may be each selectively heated by adjusting the frequency of the alternating electric field.

Under the first alternating electric field, the dipole layer 56 has a loss tangent greater than a loss tangent of each of the hard mask layer 57, the gate dielectric layer 52, and the interfacial layer 51 so as to permit the dipole layer 56 to be selectively heated by the first alternating electric field. Therefore, the dipole layer 56 (see FIG. 23) has a temperature higher than that of each of the hard mask layer 57, the gate dielectric layer 52, and the interfacial layer 51.

In some embodiments, a temperature gradient between the dipole layer 56 and the interfacial layer 51 is generated by applying the first alternating electric field to permit the second dipole elements in the dipole layer 56 to be driven to the interfacial layer 51. Furthermore, since the hard mask layer 57 has a temperature lower than that of the dipole layer 56, the metal elements (e.g., Al) in the hard mask layer 57 are less likely to diffuse into the gate dielectric layer 52, thereby preventing the CET value of the gate dielectric layer 52 from being increased.

In some embodiments, the first selected frequency of the first alternating electric field ranges from about 1 GHz to about 300 GHz. Relaxation phenomenon may not occur when the first selected frequency is less than about 1 GHz, and the intrinsic structure of the dipole layer 56 may be damaged when the first selected frequency is greater than about 300 GHz.

In some embodiments, the first alternating electric field is applied intermittently (i.e., a pulsed electric field) with a plurality of pulsing cycles. By controlling parameters (e.g., a number of the pulsing cycles, a duty-on time period per pulsing cycle, and so on) of the pulsed electric field, drive-in amounts of the second dipole elements and diffusion depth of the second dipole elements may be controlled so as to obtain a desired concentration profile of the second dipole elements in the doped interfacial layer 51D. Furthermore, by controlling the abovementioned parameters, the hard mask layer 57, the gate dielectric layer 52, and the interfacial layer 51 may be prevented from being heated up by the dipole layer 56 through thermal conduction, thereby avoiding undesired diffusion.

In some embodiments, each of the pulsing cycle may have a pulsing power ranging from about 300 W to about 1600 W. The polarization of the dipole layer 56 may not occur when the pulsing power is lower than about 300 W, and the dipole layer 56 may be damaged when the pulsing power is greater than about 1600 W.

In some embodiments, in step 209, the first alternating electric field may be applied for a total time period ranging from about 3 seconds to about 7 seconds.

In some embodiments, step 209 may have about 1 to about 30 pulsing cycles in step 209. Each of the pulsing cycle includes a duty-on step and a duty-off step. In some embodiments, the total time period of the duty-on steps may be about 10% to about 90% based on the total time period of application of the first alternating electric field.

Since the dipole layer 56 exhibits a higher kinetic energy under the first alternating electric field, a diffusion activation barrier energy for diffusion of the second dipole elements in the dipole layer 56 may be reduced. Therefore, by using the first alternating electric field, the dipole layer 56 is heated to a predetermined temperature which is sufficient to permit diffusion of the second dipole elements into the dipole layer 56, and which may be lower than a temperature of the dipole layer 56 heated using a rapid thermal annealing process to permit the diffusion of the second dipole elements. In some embodiments, the predetermined temperature ranges from about 400° C. to about 700° C.

By using dielectric heating, the dipole layer 56 may be quickly heated to the predetermined temperature during the duty-on step in each of the pulsing cycles, and a time period of each of the duty-on steps may be shorter than that of a spike annealing process. In some embodiments, the time period of each of the duty-on steps may be in millisecond range. The second dipole elements are gradually driven toward the interfacial layer 51 during the duty-on step in each of the pulsing cycles. When the desired concentration profile of the second dipole elements is achieved, the pulsing power is turned off to permit fast cooling down of the dipole layer 56 so that diffusion of the second dipole elements may be immediately stopped, thereby avoiding over-diffusion of the second dipole elements.

After step 209, as shown in FIG. 24, the dipole layer 56 shown in FIG. 23 is formed into an intermixing layer 561, and the interfacial layer 51 shown in FIG. 23 is formed into the doped interfacial layer 51D. The intermixing layer 561 has a concentration of the second dipole elements less than that of the second dipole elements in the dipole layer 56, because the second dipole elements have been driven to the doped interfacial layer 51D.

Figure 25:
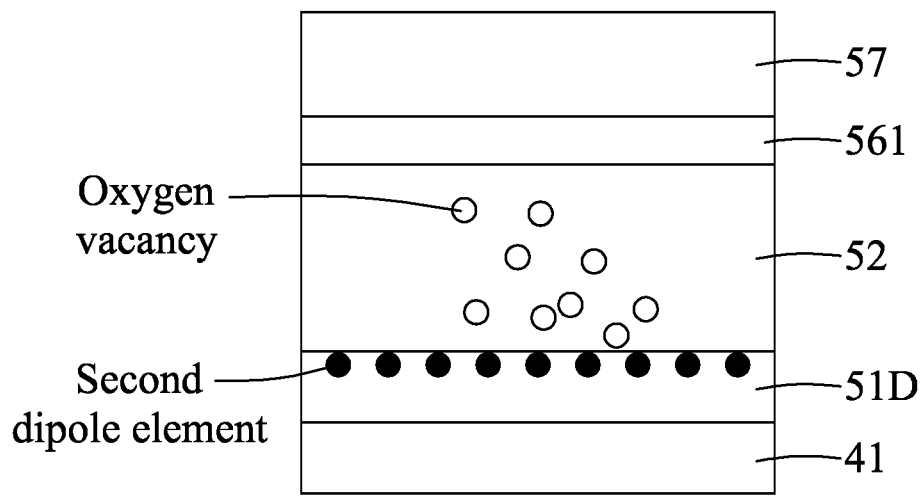

Referring to FIG. 22 and the example illustrated in FIG. 25, the method 200 proceeds to step 210, where a second alternating electric field (e.g., a second electromagnetic radiation) with a second selected frequency is applied to the structure shown in FIG. 24 so as to selectively rotate molecules of the second dipole elements, thereby stabilizing the second dipole elements in the doped interfacial layer 51D. The second selected frequency is different from the first selected frequency. FIG. 25 is a view similar to that of FIG. 24, but illustrating the structure after step 210. In some embodiments, the second selected frequency is lower than the first selected frequency.

In some embodiments, the second selected frequency ranging from about 10 MHz to about 100 MHz so that the doped interfacial layer 51D is selectively heated. In some embodiments, the second alternating electric field is applied intermittently with a plurality of pulsing cycles. In some embodiments, each of the pulsing cycle may have a pulsing power ranging from about 300 W to about 800 W. In some embodiments, the second alternating electric field in step 210 may be applied for a total time period ranging from about 5 seconds to about 10 seconds. In some embodiments, step 210 may have about 1 to about 30 pulsing cycles in step 210. Each of the pulsing cycle includes a duty-on step and a duty-off step. In some embodiments, the total time period of the duty-on steps may be about 10% to about 90% based on the total time period of application of the second alternating electric field. In some embodiments, the time period of each of the duty-on steps may be in millisecond range.

In some embodiments, the doped interfacial layer 51D may be heated up to a temperature ranging from about 100° C. to about 300° C. After step 210, the second dipole elements may be covalently bonded to oxygen atoms which are originally covalently bonded to the silicon atoms of the interfacial layer 51 (see FIG. 23) rather than occupying interstitial sites of the doped interfacial layer 51D.

Figure 26:
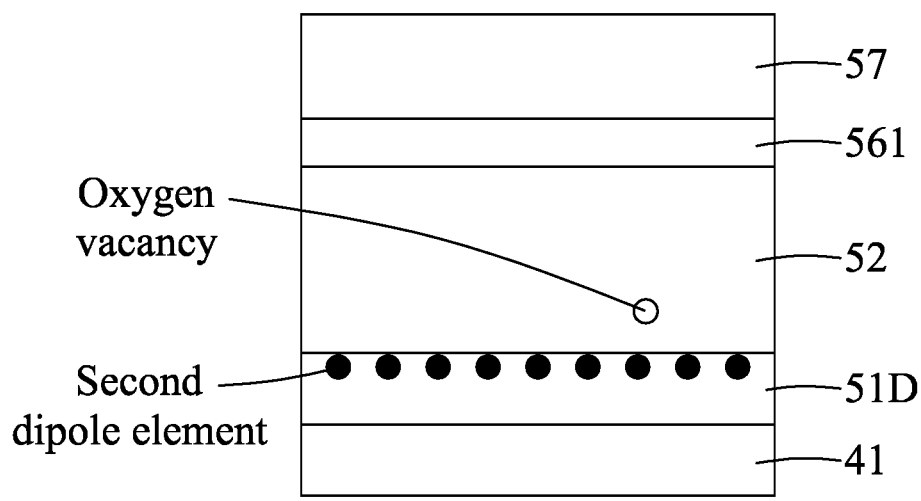

Referring to FIG. 22 and the example illustrated in FIG. 26, the method 200 proceeds to step 211, where a third alternating electric field (e.g., a third electromagnetic radiation) with a third selected frequency is applied to the structure shown in FIG. 25 such that the gate dielectric layer 52 is selectively heated, thereby reducing defects (e.g., oxygen vacancies, undesired elements) in the gate dielectric layer 52. The third selected frequency is different from the first and second selected frequencies. FIG. 26 is a view similar to that of FIG. 25, but illustrating the structure after step 211. In some embodiments, the third selected frequency ranges from about 10 MHz to about 1 GHz.

In some embodiments, the alternating electric field is applied intermittently to eliminate a thermal conduction between the gate dielectric layer 52 and the doped interfacial layer 51D, so that the desired concentration profile of the second dipole elements obtained in step 219 may not change. In some embodiments, for example, but not limited to, the gate dielectric layer 52 may be heated up to a temperature ranging from about 200° C. to about 300° C.

In some embodiments, the third selected frequency ranging from about 10 MHz to about 1 GHz so that the gate dielectric layer 52 is selectively heated. In some embodiments, the third alternating electric field is applied intermittently with a plurality of pulsing cycles. In some embodiments, each of the pulsing cycle may have a pulsing power ranging from about 300 W to about 1000 W. In some embodiments, the third alternating electric field may be applied for a total time period ranging from about 3 seconds to about 10 seconds. In some embodiments, step 211 may have about 1 to about 30 of the pulsing cycles in step 211. Each of the pulsing cycle includes a duty-on step and a duty-off step. In some embodiments, the total time period of the duty-on steps may be about 10% to about 90% based on the total time period of application of the third alternating electric field. In some embodiments, the time period of each of the duty-on steps may be in millisecond range.

After step 211, since defects such as undesired elements in the gate dielectric layer 52 are reduced, the CET value of the gate dielectric layer 52 may be kept without being increased. Step 211 may achieve a purpose similar to that of the abovementioned reliability anneal. In the case that the abovementioned reliability anneal is performed by the dielectric heating, the gate dielectric layer 52, rather than the entire structure shown in FIG. 26, is selectively heated up. Therefore, over-diffusion of the second dipole elements may be avoided.

Figure 27:
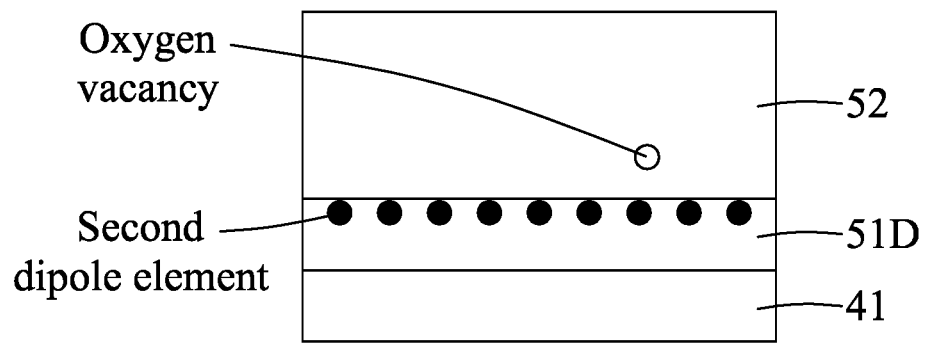

Referring to FIG. 22 and the example illustrated in FIG. 27, the method 200 proceeds to step 212, where the hard mask layer 57 and the intermixing layer 561 shown in FIG. 26 are removed. FIG. 27 is a view similar to that of FIG. 26, but illustrating the structure after step 212. Step 212 is similar to step 110 described above with reference to FIGS. 15 and 16 (the intermixing layer 561 shown in FIG. 26 is similar to the dipole layer 56 at the region n01 shown in FIG. 14), and thus details thereof are omitted for the sake of brevity.

Figure 28:
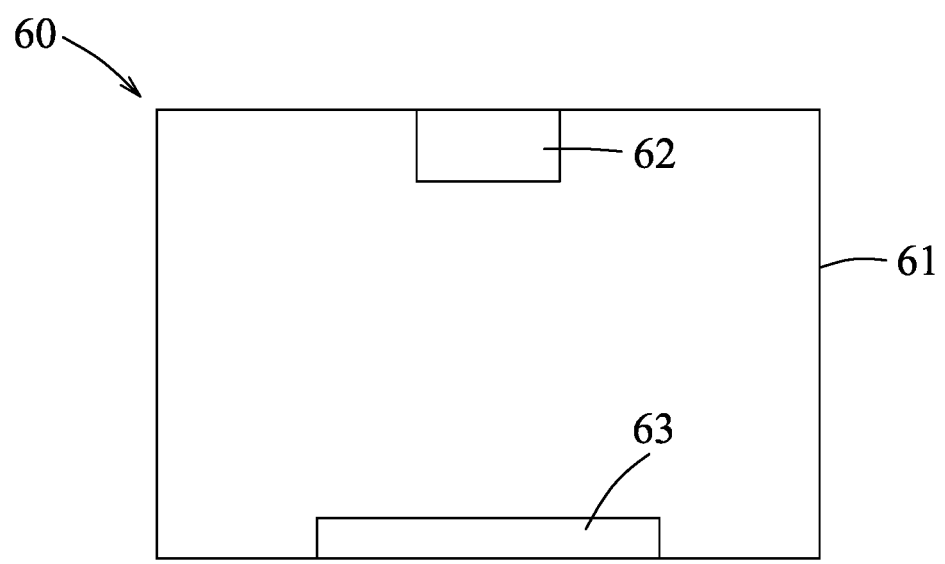
FIG. 28 is a schematic sectional view illustrating an apparatus for providing an alternating electric field or an electromagnetic wave for treating a semiconductor device in accordance with some embodiments.

FIG. 28 is a schematic sectional view illustrating an apparatus 60 for providing an alternating electric field or an electromagnetic wave for treating a semiconductor structure in accordance with some embodiments.

The apparatus 60 includes a chamber 61, an antenna array 62, and a substrate retainer 63 for retaining the semiconductor structure (e.g., each of the structures shown in FIGS. 24 to 26) thereon. The antenna array 62 may generate the alternating electric field or the electromagnetic wave with various tunable parameters, such as frequency (e.g., the first, second and third selected frequency), power, phasor, interference pattern, direction or angle of radiation, but are not limited thereto. In some embodiments, the antenna array 62 may also generate a pulsed alternating electric field or a pulsed electromagnetic wave with various tunable parameters, such as pulsing power, pulsing cycles, duty-on time period per pulsing cycle, etc. By controlling the abovementioned parameters, the dipole layer 56, the doped interfacial layer 51D and the gate dielectric layer 52 in each of regions n01, n02, n03, p01, p02, p03s may be selectively and uniformly heated, and uniformity of the semiconductor devices 30 within the semiconductor structure 20 obtained thereafter can be improved.

In some other embodiments, the first dipole elements may be driven into the gate dielectric layer 52 by the dielectric heating. In this case, step 205 may include (i) applying a fourth alternating electric field with a fourth selected frequency so as to selectively heat up the first dipole layer 53, and (ii) applying a fifth alternating electric field with a fifth selected frequency so as to selectively heat up the gate dielectric layer 52.

Under the fourth alternating electric field, at each of regions n02, n03, p01, p02 shown in FIG. 10, the dipole layer 53 has a loss tangent greater than a loss tangent of each of other elements (such as the gate dielectric layer 52, the interfacial layer 51 and so on) so as to permit the dipole layer 53 to be selectively heated. In some embodiments, a temperature gradient between the dipole layer 53 and the interfacial layer 51 is generated by applying the fourth alternating electric field to permit diffusion of the first dipole elements in the dipole layer 53 to the gate dielectric layer 52, and the gate dielectric layer 52 at each of regions n02, n03, p01, p02 is formed into the doped gate dielectric layer 52D.

Under the fifth alternating electric field, the doped gate dielectric layer 52D at each of regions n02, n03, p01, p02 is selectively heated so as to selectively rotate molecules of the first dipole elements in the doped gate dielectric layer 52D. Thereafter, at least one of the first dipole elements may be covalently bonded to oxygen atoms which are originally covalently bonded to the metal elements (e.g., Hf) of the gate dielectric layer 52 rather than occupying an interstitial site of the doped gate dielectric layer 52D.

In some alternative embodiments, other suitable methods may also be applied for forming the semiconductor structure 20.

Figure 29:
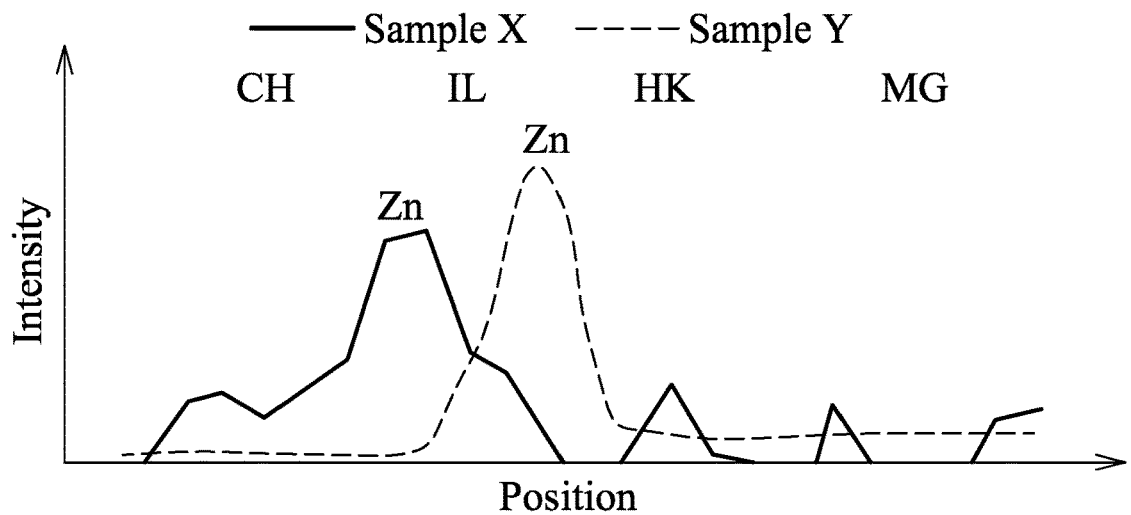
FIG. 29 is an energy-dispersive X-ray spectroscopy (EDS) line scan result for Samples X and Y in accordance with some embodiments.

FIG. 29 is an energy dispersive X-ray spectroscopy (EDS) line scan result for Samples X and Y in accordance with some embodiments, in which zinc is selected as a material of the second dipole elements (hereinafter referred to as Zn elements). As shown in FIG. 29, an axis of abscissa represents a position in a structure which is similar to one of the semiconductor devices 30 shown in FIG. 19, an axis of ordinate represents an intensity of the EDS signal, a distance range (position) of a channel layer is represented by "CH," a distance range (position) of an interfacial layer is represented by "IL," a distance range (position) of a gate dielectric layer is represented by "HK," and a distance range (position) of a gate electrode is represented by "MG." It can be seen that when the dielectric heating is well controlled, the Zn elements are distributed in the interfacial layer in proximity to the gate dielectric layer (see Sample Y). When the dielectric heating is not well controlled and causes over-diffusion of the Zn elements, the Zn elements are present at an interface between the channel layer and the interfacial layer (see Sample X).

Figure 30:
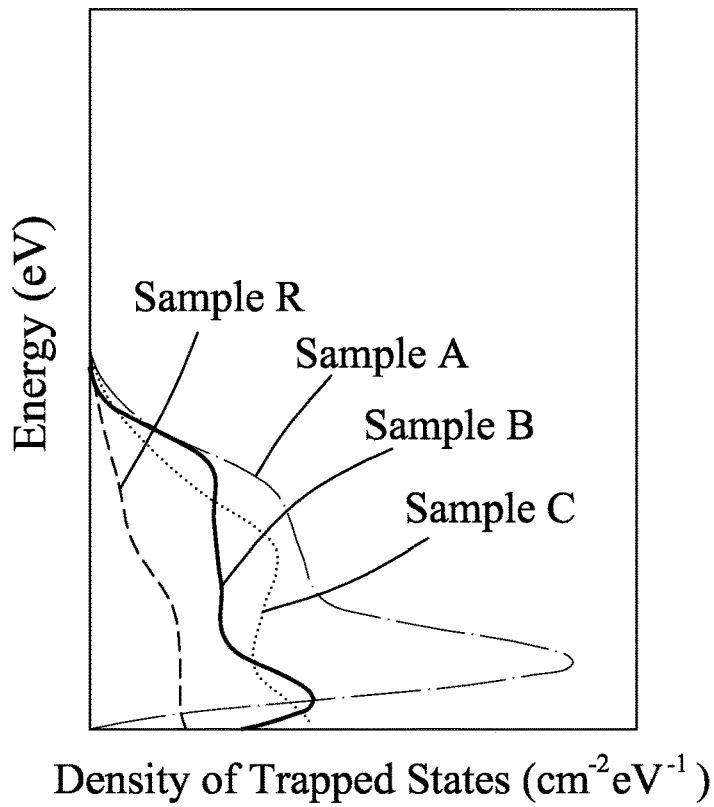
FIG. 30 is a graph illustrating variations of energy level versus density of trapped state per area for Samples A, B, C and R in accordance with some embodiments.

FIG. 30 is a graph illustrating variations of energy level versus density of trapped state per area for Samples A, B, C and R in accordance with some embodiments. Sample A has a structure similar to one of the semiconductor devices 30 shown in FIG. 19 but without introduction of the F elements and the H elements. Sample R has a structure similar to the one of the semiconductor devices 30 shown in FIG. 19, but without introduction of the second dipole elements, the F elements and the H elements. Sample B has a structure similar to the one of the semiconductor devices 30 shown in FIG. 19, but without the H elements. Sample C has a structure similar to the one of the semiconductor devices 30 shown in FIG. 19, but without introduction of the F elements. The trapped states may be observed near the valence band edge of the channel layer 41, and the major carriers in the channel layer 41 may be trapped in the trapped states. It can be seen that compared to Sample R, the density of the trapped states increases with introduction of the second dipole elements (see Sample A), and that compared to Sample A, the density of the trapped states significantly decreases and recovers to a lower value with introduction of the H elements or the F elements (see Samples B and C). Therefore, introduction of the second dipole elements along with the F elements and/or the H elements makes it possible to adjust the threshold voltage of the semiconductor device 30 without affecting transport of the major carriers in the channel layer 41.

In this disclosure, a dielectric heating technique is used in the fabrication of a semiconductor device. By controlling parameter(s) of an alternating electric field, dipole elements are precisely drive-in to a desired position in the semiconductor device, diffusion of other undesired elements can be effectively reduced or prevented, and defects in the gate dielectric layer are reduced without affecting the desired concentration profile of the dipole elements. Furthermore, in addition to the dipole elements, the additional elements including the F elements and/or the H elements are introduced into the semiconductor device so as to reduce interfacial defects, thereby enhancing electrical performance and reliability of the semiconductor device. Therefore, the method in this disclosure provides a flexible strategy capable of obtaining the semiconductor device with high reliability and with a wide range of tunable threshold voltage.

In accordance with some embodiments of the present disclosure, a semiconductor device includes a channel layer, an interfacial layer, a gate dielectric layer, a gate electrode, dipole elements, and additional elements. The interfacial layer is disposed on the channel layer, and includes an insulating material. The gate dielectric layer is disposed over the interfacial layer such that the channel layer is separated from the gate dielectric layer by the interfacial layer. The gate electrode is disposed on the gate dielectric layer. The dipole elements are present in at least one of the interfacial layer and the gate dielectric layer in a predetermined amount such that the semiconductor device has a predetermined threshold voltage. The additional elements are located at a region where the dipole elements are present so as to reduce interfacial defects caused by the dipole elements. The additional elements are different from the dipole elements.

In accordance with some embodiments of the present disclosure, the dipole elements include zinc (Zn), gallium (Ga), lanthanum (La), magnesium (Mg), aluminum (Al), or combinations thereof.

In accordance with some embodiments of the present disclosure, the additional elements include hydrogen (H), fluorine (F), isotopes thereof, or combinations thereof.

In accordance with some embodiments of the present disclosure, the additional elements include first elements which have hydrogen and the isotopes of hydrogen, and second elements which have fluorine and the isotopes of fluorine. An atomic concentration of each of the first elements and the second elements in the interfacial layer and the gate dielectric layer independently ranges from 0.1% to 80%.

In accordance with some embodiments of the present disclosure, a method for manufacturing a semiconductor device includes forming a patterned structure including a channel layer, forming an interfacial layer on the channel layer, forming a gate dielectric layer on the interfacial layer such that the channel layer is separated from the gate dielectric layer by the interfacial layer, introducing dipole elements into at least one of the interfacial layer and the gate dielectric layer in a predetermined amount such that the semiconductor device has a predetermined threshold voltage, and forming a gate electrode on the gate dielectric layer.

In accordance with some embodiments of the present disclosure, the dipole elements include zinc (Zn), gallium (Ga), lanthanum (La), magnesium (Mg), aluminum (Al), or combinations thereof.

In accordance with some embodiments of the present disclosure, the method further includes introducing additional elements into a region where the dipole elements are introduced so as to reduce interfacial defect caused by the introduction of the dipole elements. The additional elements include hydrogen (H), fluorine (F), isotopes thereof, or combinations thereof.

In accordance with some embodiments of the present disclosure, the additional elements include hydrogen (H), deuterium (D), or a combination thereof. The additional elements are introduced after forming the gate electrode.

In accordance with some embodiments of the present disclosure, the additional elements include fluorine (F) and the isotopes of fluorine. The additional elements are introduced after introducing the dipole elements.

In accordance with some embodiments of the present disclosure, after introduction of the dipole elements, the method further includes applying an alternating electric field with a selected frequency such that the gate dielectric layer is selectively heated, thereby reducing defects in the gate dielectric layer.

In accordance with some embodiments of the present disclosure, the selected frequency of the alternating electric field ranging from 10 MHz to 1 GHz.

In accordance with some embodiments of the present disclosure, the alternating electric field is applied intermittently to eliminate a thermal conduction between the gate dielectric layer and the interfacial layer.

In accordance with some embodiments of the present disclosure, the gate dielectric layer is heated up to a temperature ranging from 200° C. to 300° C.

In accordance with some embodiments of the present disclosure, a method for manufacturing a semiconductor device includes forming an interfacial layer, forming a gate dielectric layer on the interfacial layer, forming a dipole layer on the gate dielectric layer, and applying a first alternating electric field with a first selected frequency to selectively heat the dipole layer such that the dipole layer has a temperature higher than that of each of the gate dielectric layer and the interfacial layer to permit dipole elements in the dipole layer to be driven to at least one of gate dielectric layer and the interfacial layer.

In accordance with some embodiments of the present disclosure, under the first alternating electric field, the dipole layer has a loss tangent greater than a loss tangent of each of the gate dielectric layer and the interfacial layer so as to permit the dipole layer to be selectively heated.

In accordance with some embodiments of the present disclosure, the first selected frequency ranges from 1 GHz to 300 GHz.

In accordance with some embodiments of the present disclosure, after formation of the dipole layer and before application of the first alternating electric field, the method further includes forming a hard mask layer on the dipole layer opposite to the gate dielectric layer to stabilize the dipole layer during application of the first alternating electric field, and removing the hard mask layer together with the dipole layer after application of the first alternating electric field. The hard mask layer has a temperature lower than that of the dipole layer during application of the first alternating electric field.

In accordance with some embodiments of the present disclosure, the first alternating electric field is applied intermittently so as to prevent the hard mask layer, the gate dielectric layer, and the interfacial layer from being heated up by the dipole layer through thermal conduction.

In accordance with some embodiments of the present disclosure, after application of the first alternating electric field, the method further includes applying a second alternating electric field with a second selected frequency different from the first selected frequency so as to selectively rotate molecules of the dipole elements, thereby stabilizing the dipole elements in the at least one of the gate dielectric layer and the interfacial layer.

In accordance with some embodiments of the present disclosure, after application of the first alternating electric field, the method further includes applying a third alternating electric field with a third selected frequency different from the first selected frequency such that the gate dielectric layer is selectively heated, thereby reducing defects in the gate dielectric layer.

In accordance with some embodiments of the present disclosure, a method for manufacturing a semiconductor device includes forming an interfacial layer, forming a gate dielectric layer on the interfacial layer, forming a dipole layer on the gate dielectric layer such that the gate dielectric layer is sandwiched between the interfacial layer and the dipole layer, and generating a temperature gradient between the dipole layer and the interfacial layer to permit diffusion of dipole elements in the dipole layer to at least one of the gate dielectric layer and the interfacial layer.

In accordance with some embodiments of the present disclosure, the temperature gradient is generated by applying a first electromagnetic radiation with a first selected frequency such that under the first electromagnetic radiation, the dipole layer has a loss tangent greater than a loss tangent of each of the gate dielectric layer and the interfacial layer, and is selectively heated by the first electromagnetic radiation, thereby generating the temperature gradient.

In accordance with some embodiments of the present disclosure, after application of the first electromagnetic radiation, the method further includes applying a second electromagnetic radiation with a second selected frequency different from the first selected frequency so as to selectively rotate molecules of the dipole elements, thereby stabilizing the dipole elements in the at least one of the gate dielectric layer and the interfacial layer.

In accordance with some embodiments of the present disclosure, after application of the first electromagnetic radiation, the method further includes applying a third electromagnetic radiation with a third selected frequency different from the first selected frequency such that under the third electromagnetic radiation, the gate dielectric layer has a loss tangent greater than a loss tangent of each of the dipole layer and the interfacial layer, and is selectively heated by the third electromagnetic radiation, thereby reducing defects in the gate dielectric layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a patterned structure including a channel layer;
    forming an interfacial layer on the channel layer;
    forming a gate dielectric layer on the interfacial layer such that the channel layer is separated from the gate dielectric layer by the interfacial layer;
    introducing dipole elements into at least one of the interfacial layer and the gate dielectric layer in a predetermined amount such that the semiconductor device has a predetermined threshold voltage;
    forming a gate electrode on the gate dielectric layer; and
    introducing additional elements into a region where the dipole elements are introduced so as to reduce interfacial defect caused by the introduction of the dipole elements, the additional elements including hydrogen (H), fluorine (F), isotopes thereof, or combinations thereof.

2. The method of claim 1, wherein the dipole elements include zinc (Zn), gallium (Ga), lanthanum (La), magnesium (Mg), aluminum (Al), or combinations thereof.

3. The method of claim 1, wherein the additional elements include hydrogen (H), deuterium (D), or a combination thereof, the additional elements being introduced after forming the gate electrode.

4. The method of claim 1, wherein the additional elements include fluorine (F) and the isotopes of fluorine, the additional elements being introduced after introducing the dipole elements.

5. The method of claim 1, after introduction of the dipole elements, further comprising:
    applying an alternating electric field with a selected frequency such that the gate dielectric layer is selectively heated, thereby reducing defects in the gate dielectric layer.

6. The method of claim 5, wherein the selected frequency of the alternating electric field ranges from 10 MHz to 1 GHz.

7. The method of claim 5, wherein the alternating electric field is applied intermittently to eliminate a thermal conduction between the gate dielectric layer and the interfacial layer.

8. The method of claim 7, wherein the gate dielectric layer is heated up to a temperature ranging from 200° C. to 300° C.

9. A method for manufacturing a semiconductor device, comprising:
    forming an interfacial layer;
    forming a gate dielectric layer on the interfacial layer;
    forming a dipole layer on the gate dielectric layer;
    applying a first alternating electric field with a first selected frequency to selectively heat the dipole layer such that the dipole layer has a temperature higher than that of each of the gate dielectric layer and the interfacial layer to permit dipole elements in the dipole layer to be driven to at least one of the gate dielectric layer and the interfacial layer; and
    after application of the first alternating electric field, applying a second alternating electric field with a second selected frequency different from the first selected frequency so as to selectively rotate molecules of the dipole elements, thereby stabilizing the dipole elements in the at least one of the gate dielectric layer and the interfacial layer.

10. The method of claim 9, wherein, under the first alternating electric field, the dipole layer has a loss tangent greater than a loss tangent of each of the gate dielectric layer and the interfacial layer so as to permit the dipole layer to be selectively heated.

11. The method of claim 10, wherein the first selected frequency ranges from 1 GHz to 300 GHz.

12. The method of claim 9, after formation of the dipole layer and before application of the first alternating electric field, further comprising:
    forming a hard mask layer on the dipole layer opposite to the gate dielectric layer to stabilize the dipole layer during application of the first alternating electric field; and
    removing the hard mask layer together with the dipole layer after application of the first alternating electric field,
    wherein the hard mask layer has a temperature lower than that of the dipole layer during application of the first alternating electric field.

13. The method of claim 12, wherein the first alternating electric field is applied intermittently so as to prevent the hard mask layer, the gate dielectric layer, and the interfacial layer from being heated up by the dipole layer through thermal conduction.

14. The method of claim 9, after application of the first alternating electric field, further comprising:
    applying a third alternating electric field with a third selected frequency different from the first selected frequency such that the gate dielectric layer is selectively heated, thereby reducing defects in the gate dielectric layer.

15. The method of claim 9, wherein
    the dipole elements include zinc (Zn), gallium (Ga), lanthanum (La), magnesium (Mg), aluminum (Al), or combinations thereof,
    the gate dielectric layer has a first region in contact with the interfacial layer and a second region which is separated from the interfacial layer by the first region, and
    an atomic concentration of the dipole elements in the first region of the gate dielectric layer is higher than an atomic concentration of the dipole elements in each of the interfacial layer and the second region of the gate dielectric layer.

16. The method of claim 9, wherein
    the dipole elements include zinc (Zn), gallium (Ga), lanthanum (La), magnesium (Mg), aluminum (Al), or combinations thereof,
    the interfacial layer has a first region in contact with the gate dielectric layer and a second region which is separated from the gate dielectric layer by the first region, and an atomic concentration of the dipole elements in the first region of the interfacial layer is higher than an atomic concentration of the dipole elements in each of the gate dielectric layer and the second region of the interfacial layer.

17. A method for manufacturing a semiconductor device, comprising:
   forming an interfacial layer;
   forming a gate dielectric layer on the interfacial layer;
   forming a dipole layer on the gate dielectric layer such that the gate dielectric layer is sandwiched between the interfacial layer and the dipole layer; and
   generating a temperature gradient between the dipole layer and the interfacial layer to permit diffusion of dipole elements in the dipole layer to at least one of the gate dielectric layer and the interfacial layer,
   wherein the temperature gradient is generated by applying a first electromagnetic radiation with a first selected frequency such that under the first electromagnetic radiation, the dipole layer has a loss tangent greater than a loss tangent of each of the gate dielectric layer and the interfacial layer, and is selectively heated by the first electromagnetic radiation, thereby generating the temperature gradient.

18. The method of claim 17, after application of the first electromagnetic radiation, further comprising:
   applying a second electromagnetic radiation with a second selected frequency different from the first selected frequency so as to selectively rotate molecules of the dipole elements, thereby stabilizing the dipole elements in the at least one of the gate dielectric layer and the interfacial layer.

19. The method of claim 17, after application of the first electromagnetic radiation, further comprising:
   applying a third electromagnetic radiation with a third selected frequency different from the first selected frequency such that under the third electromagnetic radiation, the gate dielectric layer has a loss tangent greater than a loss tangent of each of the dipole layer and the interfacial layer, and is selectively heated by the third electromagnetic radiation, thereby reducing defects in the gate dielectric layer.

20. The method of claim 17, wherein the dipole elements include zinc (Zn), gallium (Ga), lanthanum (La), magnesium (Mg), aluminum (Al), or combinations thereof.

* * * * *